(12) United States Patent
Kumon et al.

(10) Patent No.: US 10,077,365 B2
(45) Date of Patent: Sep. 18, 2018

(54) LIQUID CHEMICAL FOR FORMING WATER REPELLENT PROTECTING FILM, AND PROCESS FOR CLEANING WAFERS USING THE SAME

(71) Applicant: Central Glass Company, Limited, Ube-shi, Yamaguchi (JP)

(72) Inventors: Soichi Kumon, Matsusaka (JP); Takashi Saio, Suzuka (JP); Masanori Saito, Matsusaka (JP); Shinobu Arata, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 15/130,250

(22) Filed: Apr. 15, 2016

(65) Prior Publication Data
US 2016/0230016 A1 Aug. 11, 2016

Related U.S. Application Data

(62) Division of application No. 13/458,119, filed on Apr. 27, 2012, now Pat. No. 9,349,582.

(30) Foreign Application Priority Data

Apr. 28, 2011 (JP) .................. 2011-101351
Apr. 28, 2011 (JP) .................. 2011-102115
(Continued)

(51) Int. Cl.
*C11D 1/00* (2006.01)
*C11D 1/04* (2006.01)
(Continued)

(52) U.S. Cl.
CPC ............... *C09D 5/00* (2013.01); *C11D 1/004* (2013.01); *C11D 1/006* (2013.01); *C11D 1/04* (2013.01);
(Continued)

(58) Field of Classification Search
None
See application file for complete search history.

(56) References Cited

U.S. PATENT DOCUMENTS 7,838,425 B2 11/2010 Tomita et al.
7,985,683 B2 7/2011 Tomita et al.
(Continued)

FOREIGN PATENT DOCUMENTS

JP 5-299336 A 11/1993
JP 2001-107089 A 4/2001
(Continued)

OTHER PUBLICATIONS

Japanese-language Office Action issued in counterpart Japanese Application No. 2011-275051 dated Jun. 21, 2016 (Two (2) pages).
(Continued)

*Primary Examiner* — Eric Wayne Golightly
*Assistant Examiner* — Arlyn I Rivera-Cordero
(74) *Attorney, Agent, or Firm* — Crowell & Moring LLP

(57) ABSTRACT

A liquid chemical for forming a water repellent protecting film on a wafer having at its surface an uneven pattern and containing at least one kind of element selected from the group consisting of titanium, tungsten, aluminum, copper, tin, tantalum and ruthenium at surfaces of recessed portions of the uneven pattern, the water repellent protecting film being formed at least on the surfaces of the recessed portions. The liquid chemical is characterized by including: a water repellent protecting film forming agent; and water, and
(Continued)

characterized in that the water repellent protecting film forming agent is at least one selected from compounds represented by the following general formula [1] and salt compounds thereof and that the concentration of the water relative to the total quantity of a solvent contained in the liquid chemical is not smaller than 50 mass %.

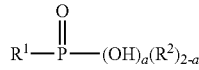

[1]

$$R^1-\overset{\overset{O}{\|}}{P}-(OH)_a(R^2)_{2-a}$$

6 Claims, 2 Drawing Sheets

(30) Foreign Application Priority Data

Mar. 30, 2012 (JP) ................ 2012-079211
Mar. 30, 2012 (JP) ................ 2012-079864

(51) Int. Cl.
| | | |
|---|---|---|
| C11D 1/34 | (2006.01) | |
| C11D 1/40 | (2006.01) | |
| C11D 1/58 | (2006.01) | |
| C11D 3/20 | (2006.01) | |
| C11D 3/28 | (2006.01) | |
| C11D 3/34 | (2006.01) | |
| C11D 3/36 | (2006.01) | |
| C11D 3/43 | (2006.01) | |
| C11D 3/00 | (2006.01) | |
| H01L 21/02 | (2006.01) | |
| H01L 21/321 | (2006.01) | |
| B08B 7/00 | (2006.01) | |
| B05D 1/18 | (2006.01) | |
| C09D 5/20 | (2006.01) | |
| C09D 5/00 | (2006.01) | |
| C11D 11/00 | (2006.01) | |

(52) U.S. Cl.
CPC ............ *C11D 1/342* (2013.01); *C11D 1/40* (2013.01); *C11D 1/58* (2013.01); *C11D 3/2079* (2013.01); *C11D 3/28* (2013.01); *C11D 3/3427* (2013.01); *C11D 3/361* (2013.01); *C11D 3/43* (2013.01); *C11D 11/0047* (2013.01); *H01L 21/02068* (2013.01); *H01L 21/02118* (2013.01); *H01L 21/02282* (2013.01); *H01L 21/321* (2013.01); *H01L 21/02052* (2013.01); *H01L 21/02093* (2013.01)

(56) References Cited

U.S. PATENT DOCUMENTS

| | | | |
|---|---|---|---|
| 2004/0259357 | A1 | 12/2004 | Saga |
| 2005/0268991 | A1* | 12/2005 | Fan ............. C23C 22/06 148/250 |
| 2007/0092673 | A1 | 4/2007 | Bruner et al. |
| 2008/0261025 | A1 | 10/2008 | Abys et al. |
| 2013/0280123 | A1 | 10/2013 | Chen et al. |
| 2015/0179433 | A1* | 6/2015 | Saio ............. H01L 21/02057 134/4 |

FOREIGN PATENT DOCUMENTS

| | | | |
|---|---|---|---|
| JP | 2003-224099 A | | 8/2003 |
| JP | 2007-173601 A | | 7/2007 |
| JP | 2008-198958 A | | 8/2008 |
| JP | 2009-512905 A | | 3/2009 |
| JP | 2010-114414 A | | 5/2010 |
| JP | 2010-129932 A | | 6/2010 |
| JP | 2010-525169 A | | 7/2010 |
| JP | 2010-192878 A | | 9/2010 |
| JP | 2013-537724 A | | 10/2013 |
| WO | WO 2010/047196 A1 | | 4/2010 |
| WO | WO 2010/084826 A1 | | 7/2010 |
| WO | WO 2012/027667 A2 | | 3/2012 |

OTHER PUBLICATIONS

Japanese Industrial Standard JIS R 3257, JIS Handbook, Mar. 20, 1999 (Eighteen (18) pages).
Japanese Industrial Standard JIS B 0601, "Machine Elements", 2007 (Sixteen (16) pages).
International Search Report dated Aug. 7, 2012 (three (3) pages).
Form PCT/ISA/237 (three (3) pages), Date: Aug. 7, 2012.
Taiwanese Office Action dated Jan. 29, 2014 {Seven (7) pages}.
Japanese-language Office Action issued in counterpart Japanese Application No. 2012-079211 dated Dec. 1, 2015 (Four (4) pages).
English Translation of JP2007-173601, accessed on Nov. 24, 2014.

\* cited by examiner ated as U.S. Pat. No. 9,349,582 on May 24, 2016, which claims priority from Japanese patent application serial no. 2012-079864, filed Mar. 30, 2012, which claims priority from Japanese patent application serial no. 2012-079211, filed Mar. 30, 2012, which claims priority from Japanese patent application serial no. 2011-102115, filed Apr. 28, 2011, which claims priority form Japanese patent application serial no. 2011-101351, filed Apr. 28, 2011, the disclosures of which are expressly incorporated by reference herein.

LIQUID CHEMICAL FOR FORMING WATER REPELLENT PROTECTING FILM, AND PROCESS FOR CLEANING WAFERS USING THE SAME

CLAIM OF PRIORITY

This application is a divisional of U.S. application Ser. No. 13/458,119, filed Apr. 27, 2012, which issued as U.S. Pat. No. 9,349,582 on May 24, 2016, which claims priority from Japanese patent application serial no. 2012-079864, filed Mar. 30, 2012, which claims priority from Japanese patent application serial no. 2012-079211, filed Mar. 30, 2012, which claims priority from Japanese patent application serial no. 2011-102115, filed Apr. 28, 2011, which claims priority form Japanese patent application serial no. 2011-101351, filed Apr. 28, 2011, the disclosures of which are expressly incorporated by reference herein.

BACKGROUND OF THE INVENTION

The present invention relates to a technique of cleaning a substrate (a wafer) in semiconductor device fabrication or the like.

Semiconductor devices for use in networks or digital household electric appliances are desired to be further sophisticated, multifunctional, and low in power consumption. Accordingly, the trend toward micro-patterning for circuits has been developed. As the development of micro-patterning proceeds, a pattern collapse of the circuits has been becoming controversial. In semiconductor device fabrication, cleaning steps for the purpose of removing particles and metallic impurities are frequently employed, which results in a 30-40% occupation of the whole of a semiconductor fabrication process by the cleaning step. If the aspect ratio of the pattern is increased with the trend toward micro-patterning of the semiconductor devices, the pattern is to collapse when a gas-liquid interface passes through the pattern after cleaning or rinsing. This phenomenon is a pattern collapse.

In Patent Publication 1, there is disclosed a technique of changing a cleaning liquid from water to 2-propanol before a gas-liquid interface passes through a pattern, as a method for suppressing the pattern collapse. However, it is said that there are some limitations, for example, a limitation that an aspect ratio of a pattern adaptable thereto is not higher than 5.

Additionally, in Patent Publication 2, there is disclosed a technique directed toward a resist pattern, as a method for suppressing the pattern collapse. This is a method of suppressing the pattern collapse by decreasing a capillary force as much as possible.

However, the technique disclosed as above is directed toward the resist pattern and is for reforming a resist itself. Moreover, a treatment agent can finally be removed together with the resist, so that it is not necessary to estimate a process of removing it after drying; therefore, this technique cannot be applied to the present object.

Furthermore, Patent Publication 3 discloses a cleaning process for preventing the pattern collapse, in which surface-reforming by oxidation or the like is conducted on a wafer surface provided to have an uneven pattern by a film containing silicon and a water repellent film is formed on the surface by using a water-soluble surfactant or a silane coupling agent to reduce the capillary force.

Additionally, in Patent Publications 4 and 5, there is disclosed a technique of preventing the pattern collapse by performing a hydrophobicity-providing treatment with use of a treatment liquid containing a silylation agent (represented by N,N-dimethylaminotrimethylsilane) and a solvent.

REFERENCES ABOUT PRIOR ART

Patent Publication

Patent Publication 1: Japanese Patent Application Publication No. 2008-198958
Patent Publication 2: Japanese Patent Application Publication No. 5-299336
Patent Publication 3: Japanese Patent No. 4403202
Patent Publication 4: Japanese Patent Application Publication No. 2010-129932
Patent Publication 5: International Application Publication No. 10/47196 Pamphlet

SUMMARY OF THE INVENTION

The present invention relates to a technique for cleaning a substrate (a wafer) in semiconductor device fabrication and the like, the objective of which is to enhance the production yield of devices having such a circuit pattern as to be particularly fine and high in aspect ratio. The present invention particularly relates to a liquid chemical for forming a water repellent protecting film and for improving a cleaning step which tends to induce a wafer having at its surface an uneven pattern to cause an uneven pattern collapse, and the like. Hitherto, there has generally been used a wafer containing silicon element at its surface; however, a wafer (hereinafter, sometimes referred to as "a metal-based wafer" or merely "a wafer") that contains at least one kind of element selected from the group consisting of titanium, tungsten, aluminum, copper, tin, tantalum and ruthenium has become used together with the diversification of the pattern. However, in a case of a wafer on which a sufficient amount of reactive functional groups e.g. silanol groups does not exist, it is not possible to form a water repellent protecting film for preventing the pattern collapse even if the treatment liquid or the treatment method discussed in Patent Publications 3 to 5 is employed, which is a problem in that the pattern collapse cannot be prevented. Moreover, the treatment liquid discussed in Patent Publications 3 to 5 is a flammable liquid containing an organic solvent and therefore allows of being improved in terms of safety or environmental burden. An object of the present invention is to provide a liquid chemical for forming a protecting film, the liquid chemical being for forming a water repellent protecting film for improving a cleaning step which tends to induce the pattern collapse, by forming a water repellent protecting film at least on the surfaces of recessed portions of a metal-based wafer so as to reduce an interaction between a liquid retained in the recessed portions and the surfaces of the recessed portions.

Additionally, the present invention relates to a technique for cleaning a substrate (a wafer) in semiconductor device fabrication and the like, the objective of which is to enhance the production yield of devices having such a circuit pattern as to be particularly fine and high in aspect ratio. The present invention particularly relates to a process for cleaning a wafer, using a liquid chemical for forming a water repellent protecting film and for improving a cleaning step which tends to induce a wafer having at its surface an uneven pattern to cause an uneven pattern collapse. In a case where the treatment liquid or the treatment method discussed in Patent Publications 3 to 5 is employed, the treatment liquid absorbs moisture from the atmosphere (the outside air) during a treatment. Moreover, since water or alcohol (e.g. 2-propanol, iPA and the like) is used in the cleaning step, there is a possibility that the treatment liquid is brought into contact with or mixed with water or alcohol which possibility sometimes results in reduction of a water repellent performance of the treatment liquid. Accordingly, the treatment liquid has been in a situation to be discarded without being recycled. Hence another object of the present invention is to provide a cleaning process which is able to economically clean a wafer by recycling a liquid chemical for forming a protecting film.

Means for Solving the Problem

The pattern collapse is to occur when an gas-liquid interface passes through the pattern at the time of drying a wafer. The reason therefor is said that a difference in height of residual liquid between a part having high aspect ratio and a part having low aspect ratio causes a difference in capillary force which acts on the pattern.

Accordingly, it is expected, by decreasing the capillary force, that the difference in capillary force due to the difference in height of residual liquid is reduced thereby resolving the pattern collapse. The magnitude of the capillary force is the absolute value of P obtained by the equation as shown below. It is expected from this equation that the capillary force can be reduced by decreasing γ or cos θ.

$$P = 2 \times \gamma \times \cos \theta / S$$

(In the equation, γ represents the surface tension of a liquid retained in the recessed portions, θ represents the contact angle of the liquid retained in the recessed portions to the surfaces of the recessed portions, and S represents the width of the recessed portions.)

First Aspect of the Present Invention

A first aspect of the present invention resides in a liquid chemical for forming a water repellent protecting film (hereinafter, sometimes referred to as "a liquid chemical for forming a protecting film" or merely "a liquid chemical"), the liquid chemical for forming a water repellent protecting film being for forming a water repellent protecting film (hereinafter, sometimes referred to as merely "a protecting film") on a wafer having at its surface an uneven pattern and containing at least one kind of element selected from the group consisting of titanium, tungsten, aluminum, copper, tin, tantalum and ruthenium at surfaces of recessed portions of the uneven pattern, the water repellent protecting film being formed at least on the surfaces of the recessed portions, the liquid chemical being characterized by including:

a water repellent protecting film forming agent (hereinafter, sometimes referred to as merely "a protecting film forming agent"); and water, wherein the water repellent protecting film forming agent is at least one selected from compounds represented by the following general formula [1] and salt compounds thereof, and wherein the concentration of the water relative to the total quantity of a solvent contained in the liquid chemical is not smaller than 50 mass %.

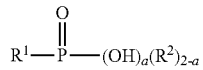

[1]

(In the formula [1], $R^1$ represents a $C_1$-$C_{18}$ monovalent hydrocarbon group the hydrogen elements of which may partially or entirely be replaced with a fluorine element(s). $R^2$ mutually independently represents a monovalent organic group having a $C_1$-$C_{18}$ hydrocarbon group the hydrogen elements of which may partially or entirely be replaced with a fluorine element(s). "a" is an integer of from 0 to 2.)

By using the protecting film forming agent represented by the above-mentioned general formula [1], it becomes possible to form a water repellent protecting film at least on the surfaces of the recessed portions of the metal-based wafer. In the protecting film forming agent, P—OH group and/or P═O group (hereinafter, these groups may generically be referred to as "a functional moiety") have compatibility with a substance including the above-mentioned metal elements. Incidentally, "having compatibility" means that Van der Waals force, a static interaction or the like acts between the surface of the substance including the metal elements and the functional moiety of the protecting film forming agent thereby causing adsorption and/or that the surface of the substance is reacted with the functional moiety of the protecting film forming agent to build a chemical bond thereby causing adsorption. Additionally, R' is a hydrophobic moiety of the protecting film forming agent; therefore, when the protecting film forming agent is adsorbed on the metal elements of the metal-based wafer, hydrophobic moieties are arranged outward from the surface of the wafer thereby imparting hydrophobicity to the wafer surface.

The metal-based wafer is a wafer containing at least one kind of element selected from the group consisting of titanium, tungsten, aluminum, copper, tin, tantalum and ruthenium at the surfaces of the recessed portions of the uneven pattern, preferably a wafer containing at least one kind of element selected from the group consisting of titanium, aluminum and ruthenium, more preferably a wafer containing at least one element of titanium and ruthenium, and particularly preferably a wafer containing titanium element. In a case of a wafer containing silicon element at the surfaces of the recessed portions of the uneven pattern, there are a multitude of silanol groups (SiOH groups) on the surfaces. These silanol groups serve as reaction points to be reacted with a silane coupling agent, so that the water repellent protecting film can easily be formed on the surfaces of the recessed portions. On the other hand, in a case of the metal-based wafer, its surface has fewer reaction points such as the silanol groups and therefore it is difficult to form the protecting film with a compound such as the silane coupling agent. Additionally, in the present invention, the wafer having at its surface an uneven pattern means a wafer which is in a condition where the uneven pattern has already been formed on the surface by etching, imprint or the like. Moreover, it is possible to adopt a wafer on which another process such as metal routing has been performed, as far as the wafer has an uneven pattern at its surface.

It is preferable that the water repellent protecting film forming agent is one having solubility in water. An excessively low solubility makes the water repellent protecting film forming agent difficult to be sufficiently contained in the liquid chemical for forming a water repellent protecting film, which is therefore not preferable. Meanwhile, an excessively high solubility tends to present a difficulty in imparting an enough water repellency to the surface of the metal-based wafer, which is therefore not preferable. Accordingly, the solubility of the water repellent protecting film forming agent in water is preferably from 5 to 100000 mass ppm, particularly preferably from 10 to 50000 mass ppm, and much more preferably from 15 to 10000 mass ppm.

Moreover, the water repellent protecting film forming agent is preferably at least one selected from compounds represented by the following general formula [2] and salt compounds thereof.

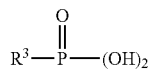

[2]

(In the formula [2], $R^3$ represents a $C_1$-$C_{18}$ monovalent hydrocarbon group the hydrogen elements of which may partially or entirely be replaced with a fluorine element(s).)

Furthermore, the water repellent protecting film forming agent is more preferably a compound represented by the above general formula [2].

The liquid chemical for forming a protecting film, according to the present invention is used in such a manner as to substitute a cleaning liquid with the liquid chemical in a step for cleaning the metal-based wafer. Additionally, the substituted liquid chemical may be substituted with another cleaning liquid.

While the cleaning liquid is substituted with the liquid chemical for forming a protecting film and the liquid chemical is retained at least in the recessed portions of the uneven pattern as discussed above, the protecting film is formed at least on the surfaces of the recessed portions of the uneven pattern. The protecting film of the present invention may not necessarily continuously be formed and may not necessarily uniformly be formed. However, in order to impart more excellent water repellency, it is preferable to form the protecting film continuously and uniformly.

In the present invention, the protecting film is a water repellent protecting film which is formed at least on the surfaces of the recessed portions by retaining the liquid chemical for forming a protecting film at least in the recessed portions at the time of cleaning the metal-based wafer. The water repellent protecting film is a film formed from the water repellent film forming agent and/or a reaction product thereof, and is a film that can reduce the wettability of the wafer surface, i.e., a film that can impart water repellency to the same. In the present invention, the water repellency means to decrease a surface energy of a surface of an article thereby weakening the interaction such as a hydrogen bond, intermolecular forces and the like between water or other liquid and the surface of the article (i.e., at the interface). The effect of reducing the interaction is particularly exhibited with water, but the effect of reducing the interaction is exhibited also with a mixture liquid of water and a liquid other than water or with a liquid other than water. With such a reduction of the interaction, the contact angle of the liquid to the article surface can be increased.

A process for cleaning a wafer, according to the present invention is a process for cleaning a wafer having an uneven pattern at its surface, the wafer containing at least one kind of element selected from the group consisting of titanium, tungsten, aluminum, copper, tin, tantalum and ruthenium at surfaces of recessed portions of the uneven pattern, the process is characterized by including at least the steps of:

a water repellent protecting film forming step in which a liquid chemical for forming a protecting film is retained at least in the recessed portions of the uneven pattern;

a drying step in which a liquid is removed from the uneven pattern by drying; and a film removing step in which the protecting film is removed, wherein the liquid chemical for forming a protecting film includes a water repellent protecting film forming agent and water, wherein the water repellent protecting film forming agent is at least one selected from compounds represented by the general formula [1] and salt compounds thereof, and wherein the concentration of the water relative to the total quantity of a solvent contained in the liquid chemical is not smaller than 50 mass %.

In the present invention, the protecting film is formed at least on the surfaces of the recessed portions of the uneven pattern when a liquid is removed from or dried out of the recessed portions. Therefore, the capillary force which acts on the recessed portions is so reduced that the pattern collapse becomes difficult to occur. Additionally, the protecting film is to be removed after the drying step.

Further, the process preferably includes a water-based cleaning step in which a water-based cleaning liquid is retained at least in the recessed portions of the uneven pattern, the water-based cleaning step being conducted earlier than the water repellent protecting film forming step.

Furthermore, in the cleaning process, it is preferable that the water repellent protecting film forming agent is at least one selected from compounds represented by the general formula [2] and salt compounds thereof, and it is particularly preferable that the water repellent protecting film forming agent is at least one selected from compounds represented by the general formula [2].

Second Aspect of the Present Invention

A second aspect of the present invention resides in a process for cleaning a wafer having an uneven pattern at its surface, the wafer containing at least one kind of element selected from the group consisting of titanium, tungsten, aluminum, copper, tin, tantalum and ruthenium at surfaces of recessed portions of the uneven pattern (hereinafter, the wafer is sometimes referred to as "a metal-based wafer" or merely "a wafer"), the process being characterized by including at least the steps of:

a water repellent protecting film forming step in which a liquid chemical (hereinafter, sometimes referred to as "a liquid chemical for forming a protecting film" or merely "a liquid chemical") for forming a water repellent protecting film (hereinafter, the water repellent protecting film is sometimes referred to as merely "a protecting film") is provided at least to the recessed portions of the wafer to form a water repellent protecting film on the surfaces of the recessed portions, the liquid chemical containing a water repellent protecting film forming agent for forming a water repellent protecting film on the surface of the wafer, wherein an excess of the liquid chemical for forming a water repellent protecting film which excess occurs during the water repellent protecting film forming step, and/or a liquid chemical for forming a water repellent protecting film which liquid chemical has undergone the water repellent protecting film forming step is recalled and recycled, and wherein the water repellent protecting film forming agent is a compound having no hydrolyzable functional group.

The metal-based wafer is a wafer containing at least one kind of element selected from the group consisting of titanium, tungsten, aluminum, copper, tin, tantalum and ruthenium at the surfaces of the recessed portions of the uneven pattern, preferably a wafer containing at least one kind of element selected from the group consisting of titanium, tungsten, aluminum and ruthenium, more preferably a wafer containing at least one element of titanium, ruthenium and tungsten, and particularly preferably a wafer containing titanium element. In a case of a wafer containing silicon element at the surfaces of the recessed portions of the uneven pattern, there are a multitude of silanol groups (SiOH groups) on the surfaces. These silanol groups serve as reaction points to be reacted with a silane coupling agent, so that the water repellent protecting film can easily be formed on the surfaces of the recessed portions. On the other hand, in a case of the metal-based wafer, its surface has fewer reaction points such as the silanol groups and therefore it is difficult to form the protecting film with a compound such as the silane coupling agent. Additionally, in the present invention, the wafer having at its surface an uneven pattern means a wafer which is in a condition where the uneven pattern has already been formed on the surface by etching, imprint or the like. Moreover, it is possible to adopt a wafer on which another process such as metal routing has been performed, as far as the wafer has an uneven pattern at its surface.

The above-mentioned liquid chemical for forming a protecting film is used in such a manner as to substitute a cleaning liquid with the liquid chemical in a step for cleaning the metal-based wafer. Additionally, the substituted liquid chemical may be substituted with another cleaning liquid.

While the cleaning liquid is substituted with the liquid chemical for forming a protecting film and the liquid chemical is retained at least in the recessed portions of the uneven pattern as discussed above, the protecting film is formed at least on the surfaces of the recessed portions of the uneven pattern. The protecting film of the present invention may not necessarily continuously be formed and may not necessarily uniformly be formed. However, in order to impart more excellent water repellency, it is preferable to form the protecting film continuously and uniformly.

In the present invention, the protecting film is a water repellent protecting film which is formed at least on the surfaces of the recessed portions by retaining the liquid chemical for forming a protecting film at least in the recessed portions at the time of cleaning the metal-based wafer. The water repellent protecting film is a film formed from the water repellent film forming agent and/or a reaction product thereof, and is a film that can reduce the wettability of the wafer surface, i.e., a film that can impart water repellency to the same. In the present invention, the water repellency means to decrease a surface energy of a surface of an article thereby weakening the interaction such as a hydrogen bond, intermolecular forces and the like between water or other liquid and the surface of the article (i.e., at the interface). The effect of reducing the interaction is particularly exhibited with water, but the effect of reducing the interaction is exhibited also with a mixture liquid of water and a liquid other than water or with a liquid other than water. With such a reduction of the interaction, the contact angle of the liquid to the article surface can be increased.

At the time of retaining the liquid chemical at least in the recessed portions of the uneven pattern, the liquid chemical is in contact with the outside air, and therefore moisture is likely to be incorporated into the liquid chemical. The water repellent protecting film forming agent used in the present invention is a compound having no hydrolyzable functional group, so that hydrolysis due to the incorporated water does not occur and therefore the performances never be reduced. Hence the liquid chemical is able to maintain its performances even after the water repellent protecting film forming step. Accordingly, an excess of the liquid chemical which excess occurs during the water repellent protecting film forming step, and a liquid chemical that has undergone the water repellent protecting film forming step can be recalled to be recycled.

A wafer formed having an uneven pattern at its surface is often cleaned at its surface with water and/or a cleaning liquid containing alcohol. In the case where the cleaning liquid used at this time is mixed with or brought into contact with the liquid chemical when being substituted with the liquid chemical, the mixed amount is greater than that of the case of being mixed with the liquid chemical from the outside air. Therefore, the process for cleaning a wafer, according to the present invention is particularly effective in a process including a step for cleaning the wafer surface with water and/or a cleaning liquid containing alcohol, before the water repellent protecting film forming step.

Additionally, the water repellent protecting film forming agent contained in the liquid chemical for forming a water repellent protecting film used in the process for cleaning a wafer, according to the present invention is preferably at least one selected from compounds represented by the following general formulas [1] to [6] and salt compounds thereof.

$$R^1-\overset{O}{\underset{\|}{P}}-(OH)_a(R^2)_{2-a} \qquad [1]$$

(In the formula [1], $R^1$ represents a $C_1$-$C_{18}$ monovalent hydrocarbon group the hydrogen elements of which may partially or entirely be replaced with a fluorine element(s). $R^2$ mutually independently represents a monovalent organic group having a $C_1$-$C_{18}$ hydrocarbon group the hydrogen elements of which may partially or entirely be replaced with a fluorine element(s). "a" is an integer of from 0 to 2.)

$$R^3-\overset{O}{\underset{\|}{C}}-OR^4 \qquad [2]$$

(In the formula [2], $R^3$ represents a $C_1$-$C_{18}$ monovalent hydrocarbon group the hydrogen elements of which may partially or entirely be replaced with a fluorine element(s). $R^4$ represents a hydrogen group or a $C_1$-$C_8$ monovalent hydrocarbon group the hydrogen elements of which may partially or entirely be replaced with a fluorine element(s).)

$$(R^5)_b-NH_{3-b} \qquad [3]$$

(In the formula [3], $R^5$ mutually independently represents a $C_1$-$C_{18}$ monovalent hydrocarbon group the hydrogen elements of which may partially or entirely be replaced with a fluorine element(s). "b" is an integer of from 1 to 3.)

$$R^6(X)_c \qquad [4]$$

(In the formula [4], X mutually independently represents a mercapto group or aldehyde group. "c" is an integer of from 1 to 6. $R^6$ represents a $C_1$-$C_{18}$ monovalent hydrocarbon group the hydrogen elements of which may partially or entirely be replaced with a fluorine element(s), in which the "c" number of hydrogen element(s) or fluorine element(s) is replaced with the X group.)

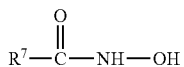

[5]

(In the formula [5], $R^7$ represents a $C_1$-$C_{18}$ monovalent hydrocarbon group the hydrogen elements of which may partially or entirely be replaced with a fluorine element(s).)

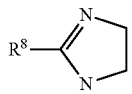

[6]

(In the formula [6], $R^8$ represents a $C_1$-$C_{18}$ monovalent hydrocarbon group the hydrogen elements of which may partially or entirely be replaced with a fluorine element(s).)

By using the protecting film forming agent represented by the above-mentioned general formulas [1] to [6], it becomes possible to form a water repellent protecting film at least on the surfaces of the recessed portions of the metal-based wafer. In the protecting film forming agent, P—OH group, P═O group, C(O)OR$^4$ group, NH$_{3-b}$ group, X group, —CONHOH group and a group represented by the following formula [9] (hereinafter, these groups may generically be referred to as "a functional moiety") have compatibility with a substance including the above-mentioned metal elements. Incidentally, "having compatibility" means that Van der Waals force, a static interaction or the like acts between the surface of the substance including the metal elements and the functional moiety of the protecting film forming agent thereby causing adsorption and/or that the surface of the substance is reacted with the functional moiety of the protecting film forming agent to build a chemical bond thereby causing adsorption. Additionally, $R^1$, $R^3$, $R^5$, $R^6$, $R^7$ and $R^8$ are hydrophobic moieties of the protecting film forming agent; therefore, when the protecting film forming agent is adsorbed on the metal elements of the metal-based wafer, the hydrophobic moieties are arranged outward from the surface of the wafer thereby imparting hydrophobicity to the wafer surface.

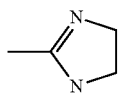

[9]

In addition, the water repellent protecting film forming agent is preferably at least one selected from compounds represented by the following general formulas [7] and [8] and salt compounds thereof.

$$R^9-\overset{\overset{\displaystyle O}{\|}}{P}-(OH)_2 \qquad [7]$$

(In the formula [7], $R^9$ represents a $C_1$-$C_{18}$ monovalent hydrocarbon group the hydrogen elements of which may partially or entirely be replaced with a fluorine element(s).)

$$R^{10}-NH_2 \qquad [8]$$

(In the formula [8], $R^{10}$ represents a $C_1$-$C_{18}$ monovalent hydrocarbon group the hydrogen elements of which may partially or entirely be replaced with a fluorine element(s).)

Effects of the Invention

The protecting film formed from the liquid chemical for forming a protecting film, according to the present invention is excellent in water repellency. Therefore, on a wafer having at its surface an uneven pattern and containing at least one kind of element selected from the group consisting of titanium, tungsten, aluminum, copper, tin, tantalum and ruthenium at surfaces of recessed portions of the uneven pattern, the film reduces the interaction between a liquid retained in the recessed portions and the surfaces of the recessed portions, thereby exhibiting the effect of preventing the pattern collapse. By using the liquid chemical, a cleaning step conducted in a process for producing the wafer having at its surface an uneven pattern is improved without lowering throughput. Accordingly, the process for producing the wafer having the uneven pattern at its surface, conducted with use of the liquid chemical for forming a protecting film according to the present invention, is excellent in productivity. Furthermore, in the liquid chemical for forming a protecting film according to the present invention, the concentration of water relative to the total quantity of a solvent contained in the liquid chemical is not smaller than 50 mass %; therefore, in the case where a nonaqueous solvent is contained, its content is required only to be small (or not larger than 50 mass % relative to the total quantity of a solvent contained in the liquid chemical). Thus, the liquid chemical is a liquid chemical more excellent in safety and a liquid chemical lower in environmental burden. Furthermore, the liquid chemical for forming a protecting film, according to the present invention can be used repeatedly, so that a wafer can be cleaned economically.

Additionally, in the process for cleaning a wafer according to the present invention, the liquid chemical for forming a water repellent protecting film can be used repeatedly, so that it is possible to clean the wafer economically.

DETAILED DESCRIPTION

Figure 1:
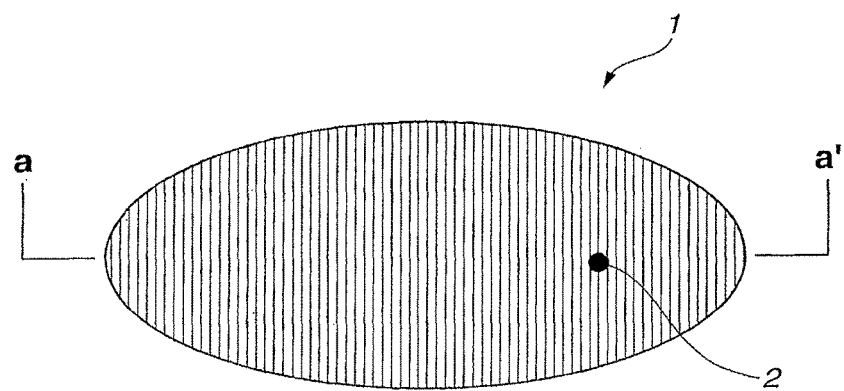
FIG. 1 is a view showing one example of schematic perspective view of a wafer 1 of which surface is made into a surface having an uneven pattern 2.

From the First Aspect of the Present Invention

First of all, the present invention will be discussed from the first aspect.

Previous to conducting a surface treatment that employs a liquid chemical for forming a protecting film of the present invention, pretreatment steps are often performed in general, the pretreatment steps being exemplified by:

a pretreatment step 1 of making a wafer surface into a surface having an uneven pattern;

a pretreatment step 2 of cleaning the wafer surface by using a water-based cleaning liquid; and a pretreatment step 3 of substituting the water-based cleaning liquid with a cleaning liquid A different from the water-based cleaning liquid (hereinafter, the cleaning liquid A different from the water-based cleaning liquid is sometimes referred to as merely "a cleaning liquid A").

Incidentally, the pretreatment step 2 or the pretreatment step 3 may be skipped in some cases.

As a pattern-forming method in the pretreatment step 1, a resist is applied to the wafer surface first of all. Thereafter, the resist is exposed through a resist mask, followed by conducting an etching removal on the exposed resist or an unexposed resist, thereby producing a resist having a desired uneven pattern. Additionally, the resist having an uneven pattern can be obtained also by pushing a mold having a pattern onto the resist. Then, the wafer is subjected to etching. At this time, the parts of the wafer surface which corresponding to recessed portions of a resist pattern are etched selectively. Finally, the resist is stripped off thereby obtaining a wafer having an uneven pattern.

By the above-mentioned pretreatment steps, it becomes possible to obtain a wafer (a metal-based wafer) having at its surface an uneven pattern and containing at least one kind of element selected from the group consisting of titanium, tungsten, aluminum, copper, tin, tantalum and ruthenium at surfaces of recessed portions of the uneven pattern. As the metal-based wafer, it is possible to cite: those obtained by coating a surface of a silicon wafer, a wafer formed of a plurality of components including silicon and/or silicon oxide ($SiO_2$), a silicon carbide wafer, a sapphire wafer, various compound semiconductor wafers, a plastic wafer or the like with a layer formed of a matter containing at least one kind of element selected from the group consisting of titanium, tungsten, aluminum, copper, tin, tantalum and ruthenium (hereinafter, the matter is sometimes referred to as "metal-based matter"); those in which at least one layer of a multilayer film formed on the wafer is a layer formed of the above-mentioned metal-based matter. The above-mentioned uneven pattern forming step is conducted on a layer including a layer of the metal-based matters. Additionally, there are included those in which at least a part of the surfaces of the recessed portions, of the surface of at which the uneven pattern is formed, serves as the metal-based matter at the time of forming the uneven pattern.

The metal-based matter is exemplified by: a matter containing titanium element, such as titanium nitride, titanium oxide, titanium and the like; a matter containing tungsten element, such as tungsten, tungsten oxide and the like; a matter containing aluminum element, such as aluminum, aluminum oxide and the like; a matter containing copper element, such as copper, copper oxide and the like; a matter containing tin element, such as tin, tin oxide and the like; a matter containing tantalum element, such as tantalum, tantalum oxide, tantalum nitride and the like; and a matter containing ruthenium element, such as ruthenium, ruthenium oxide and the like.

Additionally, also in a wafer formed of a plurality of components including the matter containing at least one kind of element of the metal-based elements, it is possible to form the protecting film on the surface of the metal-based matter. Examples of the wafer formed of a plurality of components further include: those in which the metal-based matter is formed at least at a part of the surfaces of the recessed portions; and those in which at least a part of the surfaces of the recessed portions serves as the metal-based matter at the time of forming the uneven pattern. Incidentally, where the protecting film can be formed by the liquid chemical of the present invention is at least on a surface of a portion of the metal-based matter, in the uneven pattern. Accordingly, the protecting film may be such as to be formed at least on a part of the surfaces of the recessed portions of the metal-based wafer.

Incidentally, the liquid chemical for forming a protecting film, according to the present invention can easily form an excellent water repellent protecting film on the surface of an article containing titanium element at its surface. Therefore, it is preferable that the wafer is a wafer having at its surface an uneven pattern and containing titanium element at the surfaces of the recessed portions of the uneven pattern.

Examples of the water-based cleaning liquid used in the pretreatment step 2 are water and an aqueous solution obtained by mixing at least one kind of an organic solvent, hydrogen peroxide, ozone, acid, alkali and surfactant with water (the aqueous solution having a water content of not less than 10 mass %, for example).

Furthermore, in the pretreatment step 2, substitution with the water-based cleaning liquid may be conducted twice or more. The water-based cleaning liquids to be used in this case may be different from each other.

Figure 2:
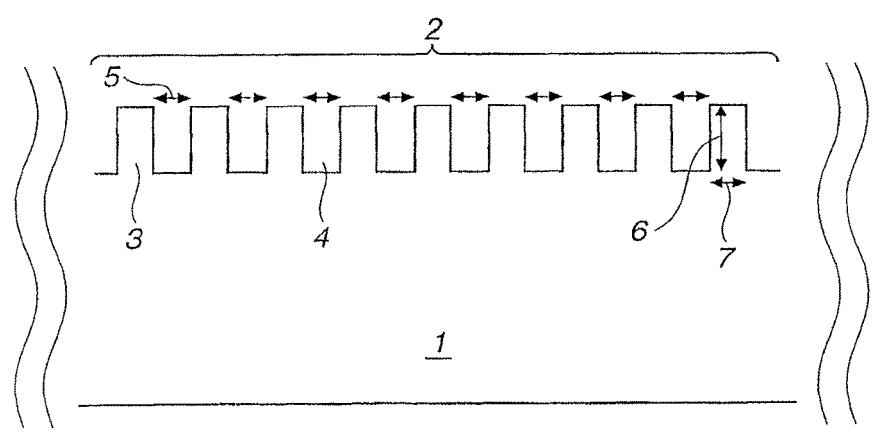
FIG. 2 is a schematic view showing a part of a-a' cross section of FIG. 1.

If recessed portions have a small width and projected portions have a large aspect ratio, and if the surface is cleaned with the water-based cleaning liquid in the pretreatment step 2 and subsequently the water-based cleaning liquid is removed by drying and the like or if water is removed by drying and the like after substituting the water-based cleaning liquid with water, a pattern collapse is to easily occur. The uneven pattern is defined as shown in FIG. 1 and FIG. 2. FIG. 1 is one example of a schematic perspective view of a wafer 1 of which surface is made into a surface having an uneven pattern 2. FIG. 2 shows a part of an a-a' cross section in FIG. 1. A width 5 of recessed portions is defined by an interval between a projected portion 3 and the projected portion 3, as shown in FIG. 2. The aspect ratio of projected portions is expressed by dividing a height 6 of the projected portions by a width 7 of the projected portions. The pattern collapse in the cleaning step is to easily occur when the recessed portions have a width of not more than 70 nm, particularly not more than 45 nm and when the aspect ratio is not less than 4, particularly not less than 6.

In the present invention, a style for cleaning the wafer is not particularly limited so long as the liquid chemical or the cleaning liquid can be retained at least in the recessed portions of the uneven pattern of the wafer. Examples of the style for cleaning the wafer are: a single cleaning style represented by spin cleaning where a generally horizontally held wafer is rotated and cleaned one by one while supplying a liquid to the vicinity of the center of the rotation; and a batch style where a plurality of wafer sheets are immersed in a cleaning bath to be cleaned. Incidentally, the form of the liquid chemical or the cleaning liquid at the time of supplying the liquid chemical or the cleaning liquid at least to the recessed portions of the uneven pattern of the wafer is not particularly limited as far as it is in a condition of liquid at time of being retained in the recessed portions, and is exemplified by liquid, vapor or the like.

The cleaning liquid A used in the pretreatment step 3 refers to an organic solvent, a mixture of the organic solvent and a water-based cleaning liquid, or a cleaning liquid into which at least one kind of acid, alkali and surfactant is mixed with these.

The organic solvent, which serves as one preferable example of the cleaning liquid A, is exemplified by hydrocarbons, esters, ethers, ketones, halogen-element containing solvents, sulfoxide-based solvents, alcohols, polyalcohol derivatives, nitrogen element-containing solvents and the like.

Incidentally, it is preferable that the cleaning liquid A is an organic solvent or a mixture liquid of water and an organic solvent in view of the cleanliness. Furthermore, it is preferable that the organic solvent contains a water-soluble organic solvent (a solubility of the water-soluble organic solvent in water is preferably not smaller than 5 mass parts by weight relative to 100 parts by weight of water) because it can be easily substituted for the water-based cleaning liquid.

Additionally, in the pretreatment step 3, substitution with the cleaning liquid A may be conducted twice or more. More specifically, the water-based cleaning liquid used in the pretreatment step 2 may be substituted with a first kind of cleaning liquid A and the first kind of cleaning liquid A may successively be substituted with two or more kinds of cleaning liquids A different from the above-mentioned cleaning liquid A, and then the liquid chemical for forming a protecting film may be substituted therefor.

Moreover, in a case where the water-based cleaning liquid used in the pretreatment step 2 can be substituted directly with the liquid chemical for forming a protecting film, substitution with the cleaning liquid A (the pretreatment step 3) may be omitted. Substitution with the cleaning liquid A can be omitted with ease because the liquid chemical for forming a protecting film of the present invention contains water, which can result in simplification of the process.

Figure 3:
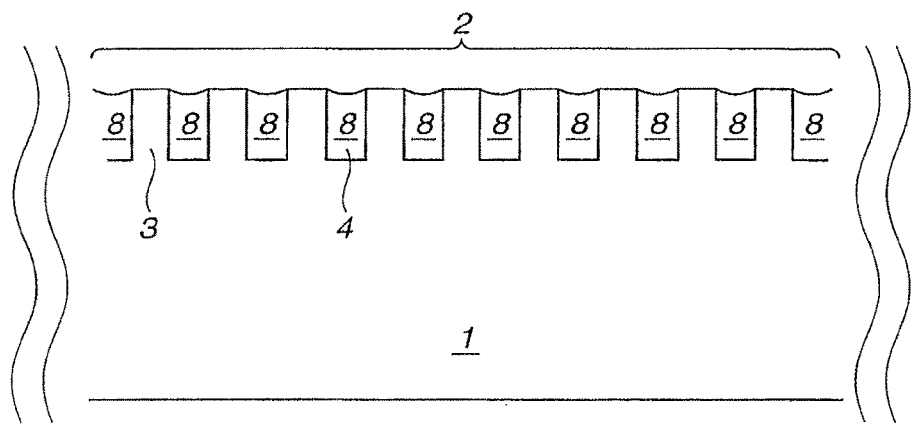
FIG. 3 is a schematic view showing a condition in which a liquid chemical 8 for forming a protecting film is retained in recessed portions 4 in a cleaning step.

FIG. 3 is a schematic view showing a condition in which a liquid chemical 8 for forming a protecting film is retained in recessed portions 4 in a protecting film forming step. The wafer of the schematic view of FIG. 3 shows a part of the a-a' cross section in FIG. 1. At this time, a protecting film is formed on the surfaces of the recessed portions 4 thereby imparting water repellency to the surfaces.

A water repellent protecting film forming agent contained in the liquid chemical for forming a water repellent protecting film which liquid chemical is used in the process for cleaning a wafer of the present invention is at least one selected from compounds represented by the general formula [1] and salt compounds thereof.

A hydrocarbon group contained in $R^2$ of the general formula [1] is exemplified by alkyl group, alkylene group, those in which hydrogen elements are partially or entirely substituted with a fluorine element(s), and the like.

Additionally, it is preferable that the above-mentioned $R^2$ is —$OR^4$ ($R^4$ is a $C_1$-$C_{18}$ hydrocarbon group). Additionally, it is preferable that $R^4$ has a carbon number of 1 to 8 and particularly 1 to 4, since a more excellent water repellency is imparted thereby. Moreover, $R^4$ is preferably a straight-chained alkyl group.

Furthermore, it is preferable that the water repellent protecting film forming agent is at least one selected from compounds represented by the general formula [2] and salt compounds thereof where "a" of the general formula [1] is 2, in order to impart a better water repellency.

Examples of $R^1$ and $R^3$ of the general formulas [1] and [2] are: alkyl group; phenyl group; phenyl group the hydrogen element of which is substituted with alkyl group; naphthyl group; these hydrocarbon groups whose hydrogen elements are partially or entirely substituted with a fluorine element(s); and the like.

Moreover, it is preferable that $R^1$ and $R^3$ of the general formulas [1] and [2] have a carbon number of 2 to 16, particularly preferably 4 to 14 and much more preferably 6 to 14, since a more excellent water repellency is imparted thereby. Additionally, the hydrocarbon group the hydrogen elements of which may partially or entirely be substituted with a fluorine element(s) is preferably alkyl group and particularly preferably a straight-chained alkyl group. If the hydrocarbon group is a straight-chained alkyl group, hydrophobic moieties of the protecting film forming agent tend to be arranged perpendicularly to the surface of the protecting film at the time of forming the protecting film so as to enhance a water-repellency-imparting effect, which is therefore further preferable. Moreover, $R^1$ and $R^3$ of the general formulas [1] and [2] bring about a far better water repellency, so that these are preferably hydrocarbon groups whose hydrogen elements are partially or entirely be substituted with a fluorine element(s).

The protecting film forming agent may exist in the form of a salt compound of a compound represented by the general formulas [1] and [2], for example, in the form of a salt such as ammonium salt, amine salt and the like.

Furthermore, the protecting film forming agent contained in the liquid chemical for forming a protecting film preferably has a concentration of 0.0005 to 2 mass % relative to the total quantity of the liquid chemical. A concentration of smaller than 0.0005 mass % tends to make the water-repellency-imparting effect insufficient, while that of larger than 2 mass % tends to be insoluble in a solvent contained in the liquid chemical. A concentration of 0.001 to 1 mass % is more preferable, and 0.0015 to 0.8 mass % is particularly preferable.

Additionally, the liquid chemical for forming a protecting film may contain a solvent other than water. Such a solvent can be exemplified by an organic solvent and can be used upon being mixed with water at a concentration of not higher than a saturation solubility in water.

As the organic solvent, there can be adopted hydrocarbons, esters, ethers, ketones, halogen element-containing solvents, sulfoxide-based solvents, lactone-based solvents, carbonate-based solvents, alcohols, polyalcohol derivatives, nitrogen element-containing solvents, and a mixture liquid of these. Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone and the like. Examples of the halogen element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dicloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifuoropropene and the like; perfluoroethers; perfluoropolyethers; and the like. Examples of the sulfoxide-based solvents are dimethyl sulfoxide and the like.

Examples of the lactone-based solvents are γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone and the like. Examples of the carbonate-based solvents are dimethyl carbonate, ethyl methyl carbonate, diethyl carbonate, propylene carbonate and the like. Examples of alcohols are methanol, ethanol, propanol, butanol, ethylene glycol, diethylene glycol, 1,2-propanediol, 1,3-propanediol, dipropylene glycol, 1,2-butanediol, 1,3-butanediol, 1,4-butanediol, triethylene glycol, tripropylene glycol, tetraethylene glycol, tetrapropylene glycol, glycerine and the like. Examples of the polyalcohol derivatives are ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether, butylene glycol monomethyl ether, ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerine triacetate and the like. Examples of the nitrogen element-containing solvents are formamide, N,N-dimethylformamide, N,N-dimethylacetamide, N-methyl-2-pyrrolidone, diethylamine, triethylamine, pyridine and the like.

With consideration given to a protecting film forming ability that the liquid chemical for forming a protecting film has, it is preferable that the solvent contained in the liquid chemical is water or a mixture liquid obtained by mixing water with esters, ethers, ketones, polyalcohol derivatives having no hydroxyl group. Furthermore, with consideration given to solubility in water, a solvent to be mixed with water is preferably a polyalcohol derivative; it is particularly preferable to use a polyalcohol derivative having no hydroxyl group because of its good protecting film forming ability. Additionally, alcohols and the polyalcohol derivatives having hydroxyl group provide the protecting film forming agent with an excellent solubility. When such a solvent is used as the solvent contained in the liquid chemical, therefore, the protecting film forming agent can be dissolved at a high concentration. Since a liquid chemical having a good protecting film forming ability can be thus easily obtained, such a solvent may be used as the solvent contained in the liquid chemical.

A larger content of water in the liquid chemical tends to make the liquid chemical higher in flash point, which results in reduction of the risk. It is therefore particularly preferable that the concentration of water relative to the total quantity of the solvent contained in the liquid chemical is not lower than 60 mass %, much more preferably not lower than 70 mass %.

Additionally, in order to accelerate the formation of the protecting film by virtue of the protecting film forming agent, a catalyst may be added to the liquid chemical for forming a protecting film. The amount of the addition of the catalyst is preferably 0.01 to 50 mass % relative to the total quantity of 100 mass % of the protecting film forming agent.

When increasing the temperature of the liquid chemical for forming a protecting film, the protecting film can be formed in a shorter time. A temperature at which a uniform protecting film can be readily formed is not lower than 10° C. and lower than the boiling point of the liquid chemical. Particularly, it is preferable to keep a temperature of not lower than 15° C. and not higher than a temperature 10° C. lower than the boiling point of the liquid chemical. It is preferable that the temperature of the liquid chemical is kept at the above-mentioned temperature while the liquid chemical is being retained at least in the recessed portions of the uneven pattern.

The liquid chemical for forming a protecting film, used in the protecting film forming step may be reused in other subsequent treatments for wafer. For example, in the case of the above-mentioned single cleaning style, a liquid chemical having been provided to a wafer and then left the wafer is collected and can be reused in other subsequent wafer treatments. Meanwhile, in the case of the above-mentioned batch style, a batch of liquid chemical treatment is conducted in a treatment bath and then a wafer is taken out thereof, thereafter, a liquid chemical left in the treatment bath can be used for a subsequent batch.

Incidentally, a reusable liquid chemical may be reused upon being partially discarded or may be used with the addition of an additional liquid chemical. Furthermore, the reusable liquid chemical may be used upon performing a purification operation such as: removal of metal impurities, for example, by an ion-exchange resin, distillation and the like; removal of contaminants including particles etc., for example, by filtration; and the like.

After the protecting film forming step, the liquid chemical retained at least in the recessed portions of the uneven pattern may be substituted with a cleaning liquid different from the above-mentioned liquid chemical (hereinafter, this cleaning liquid different from the above-mentioned liquid chemical is sometimes referred to as "a cleaning liquid B") (hereinafter, this step is sometimes referred to as "a subsequent cleaning step"), and then may be brought into a drying step. Examples of the cleaning liquid B are: a water-based cleaning liquid, an organic solvent; a mixture of the water-based cleaning liquid and the organic solvent; those into which at least one kind of acid, alkali and a surfactant is mixed; these in which the protecting film forming agent used for the liquid chemical for forming a protecting film is contained at a concentration lower than that of the liquid chemical; and the like. From the viewpoint of removing particles and metal impurities, it is more preferable that the cleaning liquid B is water, an organic solvent or a mixture of water and the organic solvent.

Furthermore, in the subsequent cleaning step, substitution with the cleaning liquid B may be conducted twice or more. More specifically, the liquid chemical for forming a protecting film may be substituted with a first kind of cleaning liquid B and the first kind of cleaning liquid B may successively be substituted with two or more kinds of cleaning liquids B different from the above-mentioned cleaning liquid B, followed by the drying step.

The organic solvent, which serves as one of the preferable examples of the cleaning liquid B, are exemplified by hydrocarbons, esters, ethers, ketones, halogen element-containing solvents, sulfoxide-based solvents, lactone-based solvents, carbonate-based solvents, alcohols, polyalcohol derivatives, nitrogen element-containing solvents and the like.

In addition, the protecting film formed on the wafer surface by the liquid chemical of the present invention is preferable when an organic solvent is used as the cleaning liquid B since reduction of the water repellency by the subsequent cleaning step is little.

Figure 4:
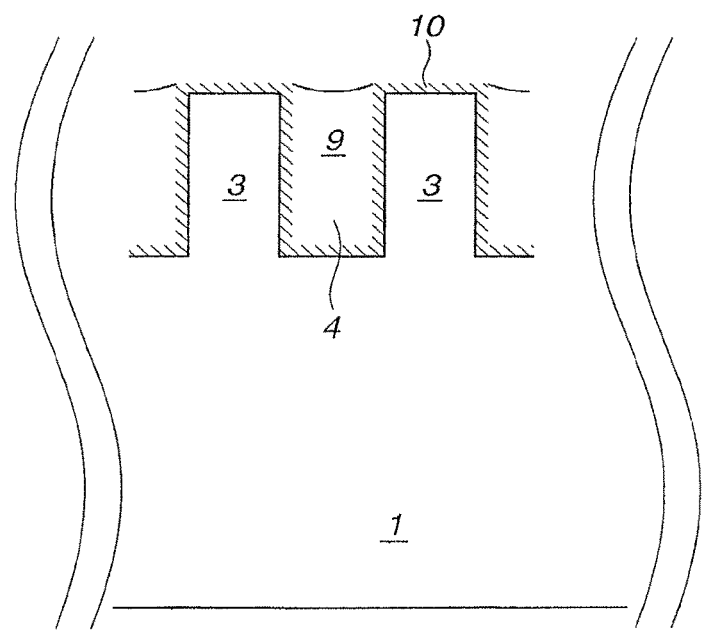
FIG. 4 is a schematic view showing a condition in which a liquid is retained in the recessed portions 4 formed having a protecting film thereon.

There is shown in FIG. 4 a schematic view showing a state where a liquid is retained in the recessed portions 4 provided with water repellency by the liquid chemical for forming a protecting film. The wafer as shown in the schematic view of FIG. 4 shows a part of the a-a' cross section in FIG. 1. The surface formed having the uneven pattern is coated with a protecting film 10 by the liquid chemical thereby being provided with water repellency. Furthermore, the protecting film 10 is retained on the wafer surface even when the liquid 9 is removed from the uneven pattern.

When the protecting film 10 is formed at least on the surfaces of the recessed portions of the uneven pattern of the wafer by the liquid chemical for forming a protecting film, a contact angle of from 50 to 130° is preferable on the assumption that water is retained on the surfaces, because the pattern collapse becomes difficult to occur thereby. It is therefore particularly preferable that the contact angle is 65 to 115° because the pattern collapse becomes further difficult to occur.

The subsequent cleaning step may be skipped if possible. If the concentration of the content of the protecting film forming agent in the liquid chemical for forming a protecting film of the present invention is within the above-mentioned range, residues of the protecting film are made difficult to remain on the wafer surface after a film removing step; therefore it is easy to skip the subsequent cleaning step, thereby allowing simplification of the process.

In the case of skipping the subsequent cleaning step, the higher the water concentration in the liquid chemical for forming a protecting film is, the larger the contact angle of the liquid chemical for forming a protecting film to the surface obtained after forming a protecting film becomes. Hence the capillary force which is to act on the recessed portions can be easily decreased. As a result, the pattern collapse becomes difficult to occur at the time of removing the liquid chemical, which is preferable. Accordingly, the concentration of water relative to the total quantity of the solvent contained in the liquid chemical for forming a protecting film is preferably not lower than 80 mass %, more preferably not lower than 90 mass %.

Then, as discussed in the drying step, there is conducted a step of removing a liquid from the uneven pattern by drying, the liquid being retained in the recessed portions 4 on which the protecting film is formed by the liquid chemical. At this time, the liquid retained in the recessed portions may be the liquid chemical used in the protecting film forming step, the cleaning liquid B used in the subsequent cleaning step, or a mixture liquid of these. The mixture liquid is one in which the protecting film forming agent is contained in the liquid chemical for forming a protecting film at a concentration lower than that of the liquid chemical, and may be a liquid which is on the way to substitution of the liquid chemical with the cleaning liquid B, or a mixture liquid obtained by previously mixing the protecting film forming agent with the cleaning liquid B. In view of the cleanliness of the wafer, there is preferably used water, an organic solvent, or a mixture of water and the organic solvent. Additionally, it is also possible to bring the cleaning liquid B retained on the unevenly patterned surface after once removing liquid from the unevenly patterned surface and to conduct drying thereafter.

Incidentally, in a case of performing a cleaning treatment after a surface treatment with the liquid chemical (i.e. in a case of performing the subsequent cleaning step), a time for this step, i.e. a time to retain the cleaning liquid B is preferably not shorter than 10 seconds, more preferably not shorter than 20 seconds from the viewpoint of removing particles and impurities from the unevenly patterned surface. In view of the effect of maintaining a water repellent performance of the protecting film formed on the unevenly patterned surface, the use of an organic solvent as the cleaning liquid B is preferable because the water repellency of the wafer surface is maintained even after conducting the subsequent cleaning step. On the other hand, a too long time for the subsequent cleaning step can reduce the productivity, and therefore the time is preferably within 15 minutes.

Furthermore, since water has a large contact angle to the surface obtained after forming a protecting film, water is able to easily decrease the capillary force which is to act on the recessed portions, which results in a lesser occurrence of the pattern collapse at the time of removing the cleaning liquid B. It is therefore water may be used as the cleaning liquid B.

In the drying step, a liquid retained on the uneven pattern is removed by drying. The drying is preferably conducted by a conventionally known drying method such as spin drying, IPA (2-propanol) steam drying, Marangoni drying, heating drying, blowing drying, warm air drying, vacuum drying and the like.

Then, as discussed in the film removing step, there is performed a step of removing the protecting film. In the case of removing the water repellent protecting film, it is effective to cleave C—C bond and C—F bond in the water repellent protecting film. A method therefor is not particularly limited so long as it is possible to cleave the above-mentioned bonds but exemplified by: irradiating the wafer surface with light; heating the wafer; exposing the wafer to ozone; irradiating the wafer surface with plasma; subjecting the wafer surface to corona discharge; and the like.

In the case of removing the protecting film by light irradiation, it is preferable to conduct an irradiation with ultraviolet rays having a wavelength of shorter than 340 nm and 240 nm (corresponding to bond energies of C—C bond and C—F bond in the protecting film, i.e., 83 kcal/mol and 116 kcal/mol, respectively). As the light source therefor, there is used a metal halide lamp, a low-pressure mercury lamp, a high-pressure mercury lamp, an excimer lamp, a carbon arc or the like. In the case of the metal halide lamp, the intensity of the ultraviolet irradiation is preferably not less than 100 mW/cm$^2$, particularly preferably not less than 200 mW/cm$^2$, as a measurement value obtained by the illuminance meter (Intensity meter UM-10 produced by Konica Minolta Sensing, Inc., Light-Receptor UM-360 [Peak sensitivity wavelength: 365 nm, Measured wavelength range: 310 to 400 nm]). Incidentally, an irradiation intensity of less than 100 mW/cm$^2$ takes a long time to remove the protecting film. Additionally, in the case of the low-pressure mercury lamp, the ultraviolet irradiation is performed with shorter wavelengths so that removal of the protecting film is achieved in a short time even if the intensity is low. This is therefore preferable.

Additionally, in the case of removing the protecting film by light irradiation, it is particularly preferable to generate ozone in parallel with decomposing the components of the protecting film by ultraviolet rays and then to induce oxidation-volatilization of the components of the protecting film by the ozone, since a treatment time is saved thereby. As the light source therefor, the low-pressure mercury lamp, the excimer lamp or the like is used. Moreover, the wafer may be heated while being subjected to light irradiation.

In the case of heating the wafer, heating of the wafer is conducted at 400 to 1000° C., preferably at 500 to 900° C. The heating time is preferably kept from 10 seconds to 60 minutes, more preferably from 30 seconds to 10 minutes. Additionally, this step may be conducted in combination with ozone exposure, plasma irradiation, corona discharge or the like. Furthermore, the light irradiation may be conducted while heating the wafer.

As the method for removing the protecting film by heating, there are a method of bringing a wafer into contact with a heat source, a method of bringing a wafer into a heated atmosphere such as a heat treatment furnace, and the like. The method of bringing a wafer into a heated atmosphere can easily and uniformly provide the wafer surface with energy for removing the protecting film even in a case where two or more wafers are subjected to a treatment. This method is operationally convenient, achieves the treatment within a short period of time and has high treatment ability. Therefore, this is an industrially advantageous method.

In the case of exposing the wafer to ozone, it is preferable to expose the wafer surface to ozone generated by ultraviolet irradiation using the low-pressure mercury lamp, low-temperature discharge using high voltages or the like. The wafer may be irradiated with light or heated while being exposed to ozone.

In the film removing step, the protecting film formed on the wafer surface can be efficiently removed by combining the above-mentioned light irradiation, heating, ozone exposure, plasma irradiation, corona discharge and the like.

From the Second Aspect of the Present Invention

Next, the present invention will be discussed from the second aspect.

Previous to conducting a surface treatment that employs the above-mentioned liquid chemical for forming a protecting film, pretreatment steps are often performed in general, the pretreatment steps being exemplified by:

a pretreatment step 1 of making a wafer surface into a surface having an uneven pattern;

a pretreatment step 2 of cleaning the wafer surface by using a water-based cleaning liquid; and a pretreatment step 3 of substituting the water-based cleaning liquid with a cleaning liquid A different from the water-based cleaning liquid (hereinafter, the cleaning liquid A different from the water-based cleaning liquid is sometimes referred to as merely "a cleaning liquid A").

Incidentally, the pretreatment step 2 or the pretreatment step 3 may be skipped in some cases.

As a pattern-forming method in the pretreatment step 1, a resist is applied to the wafer surface first of all. Thereafter, the resist is exposed through a resist mask, followed by conducting an etching removal on the exposed resist or an unexposed resist, thereby producing a resist having a desired uneven pattern. Additionally, the resist having an uneven pattern can be obtained also by pushing a mold having a pattern onto the resist. Then, the wafer is subjected to etching. At this time, the parts of the wafer surface which corresponding to recessed portions of a resist pattern are etched selectively. Finally, the resist is stripped off thereby obtaining a wafer having an uneven pattern.

By the above-mentioned pretreatment steps, it becomes possible to obtain a wafer (a metal-based wafer) having at its surface an uneven pattern and containing at least one kind of element selected from the group consisting of titanium, tungsten, aluminum, copper, tin, tantalum and ruthenium at surfaces of recessed portions of the uneven pattern. As the metal-based wafer, it is possible to cite: those obtained by coating a surface of a silicon wafer, a wafer formed of a plurality of components including silicon and/or silicon oxide ($SiO_2$), a silicon carbide wafer, a sapphire wafer, various compound semiconductor wafers, a plastic wafer or the like with a layer formed of a matter containing at least one kind of element selected from the group consisting of titanium, tungsten, aluminum, copper, tin, tantalum and ruthenium (hereinafter, the matter is sometimes referred to as "metal-based matter"); those in which at least one layer of a multilayer film formed on the wafer is a layer formed of the above-mentioned metal-based matter. The above-mentioned uneven pattern forming step is conducted on a layer including a layer of the metal-based matters. Additionally, there are included those in which at least a part of the surfaces of the recessed portions, of the surface of at which the uneven pattern is formed, serves as the metal-based matter at the time of forming the uneven pattern.

The metal-based matter is exemplified by: a matter containing titanium element, such as titanium nitride, titanium oxide, titanium and the like; a matter containing tungsten element, such as tungsten, tungsten oxide and the like; a matter containing aluminum element, such as aluminum, aluminum oxide and the like; a matter containing copper element, such as copper, copper oxide and the like; a matter containing tin element, such as tin, tin oxide and the like; a matter containing tantalum element, such as tantalum, tantalum oxide, tantalum nitride and the like; and a matter containing ruthenium element, such as ruthenium, ruthenium oxide and the like.

Additionally, also in a wafer formed of a plurality of components including the matter containing at least one kind of element of the metal-based elements, it is possible to form the protecting film on the surface of the metal-based matter. Examples of the wafer formed of a plurality of components further include: those in which the metal-based matter is formed at least at a part of the surfaces of the recessed portions; and those in which at least a part of the surfaces of the recessed portions serves as the metal-based matter at the time of forming the uneven pattern. Incidentally, where the protecting film can be formed by the liquid chemical of the present invention is at least on a surface of a portion of the metal-based matter, in the uneven pattern. Accordingly, the protecting film may be such as to be formed at least on a part of the surfaces of the recessed portions of the metal-based wafer.

Incidentally, the liquid chemical for forming a protecting film can easily form an excellent water repellent protecting film on the surface of an article containing titanium element at its surface. Therefore, it is preferable that the wafer is a wafer having at its surface an uneven pattern and containing titanium element at the surfaces of the recessed portions of the uneven pattern.

Examples of the water-based cleaning liquid used in the pretreatment step 2 are water and an aqueous solution obtained by mixing at least one kind of an organic solvent, hydrogen peroxide, ozone, acid, alkali and surfactant with water (the aqueous solution having a water content of not less than 10 mass %, for example).

Furthermore, in the pretreatment step 2, substitution with the water-based cleaning liquid may be conducted twice or more. The water-based cleaning liquids to be used in this case may be different from each other.

If recessed portions have a small width and projected portions have a large aspect ratio, and if the surface is cleaned with the water-based cleaning liquid in the pretreatment step 2 and subsequently the water-based cleaning liquid is removed by drying and the like or if water is removed by drying and the like after substituting the water-based cleaning liquid with water, a pattern collapse is to easily occur. The uneven pattern is defined as shown in FIG. 1 and FIG. 2. FIG. 1 is one example of a schematic perspective view of a wafer 1 of which surface is made into a surface having an uneven pattern 2. FIG. 2 shows a part of an a-a' cross section in FIG. 1. A width 5 of recessed portions is defined by an interval between a projected portion 3 and the projected portion 3, as shown in FIG. 2. The aspect ratio of projected portions is expressed by dividing a height 6 of the projected portions by a width 7 of the projected portions. The pattern collapse in the cleaning step is to easily occur when the recessed portions have a width of not more than 70 nm, particularly not more than 45 nm and when the aspect ratio is not less than 4, particularly not less than 6.

In the present invention, a style for cleaning the wafer is not particularly limited so long as the liquid chemical or the cleaning liquid can be retained at least in the recessed portions of the uneven pattern of the wafer. Examples of the style for cleaning the wafer are: a single cleaning style represented by spin cleaning where a generally horizontally held wafer is rotated and cleaned one by one while supplying a liquid to the vicinity of the center of the rotation; and a batch style where a plurality of wafer sheets are immersed in a cleaning bath to be cleaned. Incidentally, the form of the liquid chemical or the cleaning liquid at the time of supplying the liquid chemical or the cleaning liquid at least to the recessed portions of the uneven pattern of the wafer is not particularly limited as far as it is in a condition of liquid at time of being retained in the recessed portions, and is exemplified by liquid, vapor or the like.

The cleaning liquid A used in the pretreatment step 3 refers to an organic solvent, a mixture of the organic solvent and a water-based cleaning liquid, or a cleaning liquid into which at least one kind of acid, alkali and surfactant is mixed with these. Furthermore, it is preferable to conduct a step of retaining the liquid chemical for forming a protecting film at least in the recessed portions of the uneven pattern (i.e. a water repellent protecting film forming step) by substituting the cleaning liquid A with the liquid chemical for forming a protecting film.

The organic solvent, which serves as one preferable example of the cleaning liquid A, is exemplified by hydrocarbons, esters, ethers, ketones, halogen-element containing solvents, sulfoxide-based solvents, alcohols, polyalcohol derivatives, nitrogen element-containing solvents and the like.

Incidentally, it is preferable that the cleaning liquid A is an organic solvent or a mixture liquid of water and an organic solvent in view of the cleanliness. Furthermore, it is preferable that the organic solvent contains a water-soluble organic solvent (a solubility of the water-soluble organic solvent in water is preferably not smaller than 5 mass parts by weight relative to 100 parts by weight of water) because it can be easily substituted for the water-based cleaning liquid.

Additionally, in the pretreatment step 3, substitution with the cleaning liquid A may be conducted twice or more. More specifically, the water-based cleaning liquid used in the pretreatment step 2 may be substituted with a first kind of cleaning liquid A and the first kind of cleaning liquid A may successively be substituted with two or more kinds of cleaning liquids A different from the above-mentioned cleaning liquid A, and then the liquid chemical for forming a protecting film may be substituted therefor.

Moreover, in a case where the water-based cleaning liquid used in the pretreatment step 2 can be substituted directly with the liquid chemical for forming a protecting film, substitution with the cleaning liquid A (the pretreatment step 3) may be omitted.

Additionally, it is preferable that the process for cleaning a wafer, according to the present invention includes a step of cleaning the wafer surface with a cleaning liquid containing water and/or alcohol, as the pretreatment step 2 and/or the pretreatment step 3, earlier than the water repellent protecting film forming step.

FIG. 3 is a schematic view showing a condition in which a liquid chemical 8 for forming a protecting film is retained in recessed portions 4 in a protecting film forming step. The wafer of the schematic view of FIG. 3 shows a part of the a-a' cross section in FIG. 1. At this time, a protecting film is formed on the surfaces of the recessed portions 4 thereby imparting water repellency to the surfaces.

A water repellent protecting film forming agent contained in the liquid chemical for forming a water repellent protecting film which liquid chemical is used in the process for cleaning a wafer of the present invention is preferably at least one selected from compounds represented by the general formulas [1] to [6] and salt compounds thereof.

A hydrocarbon group contained in $R^2$ of the general formula [1] is exemplified by alkyl group, alkylene group, those in which hydrogen elements are partially or entirely substituted with a fluorine element(s), and the like.

Additionally, it is preferable that the above-mentioned $R^2$ is $-OR^{11}$ ($R^{11}$ is a $C_1$-$C_{18}$ hydrocarbon group). Additionally, it is preferable that $R^{11}$ has a carbon number of 1 to 8 and particularly 1 to 4, since a more excellent water repellency is imparted thereby. Moreover, $R^{11}$ is preferably a straight-chained alkyl group.

Furthermore, it is particularly preferable that the water repellent protecting film forming agent is at least one selected from: compounds represented by the general formula [7] where "a" of the general formula [1] is 2 and the general formula [8] where "b" of the general formula [3] is 1; and salt compounds thereof, in order to impart a better water repellency.

Further, it is preferable that the water repellent protecting film forming agent is at least one selected from compounds represented by the general formulas [7] and [8].

Furthermore, the water repellent protecting film forming agent is particularly preferably a compound represented by the general formula [7].

Examples of $R^1$, $R^3$, $R^5$, $R^6$, $R^7$, $R^8$, $R^9$ and $R^{10}$ of the general formulas [1] to [8] are: alkyl group; phenyl group; phenyl group the hydrogen element of which is substituted with alkyl group; naphthyl group; these hydrocarbon groups whose hydrogen elements are partially or entirely substituted with a fluorine element(s); and the like.

Moreover, it is preferable that $R^1$, $R^3$, $R^5$, $R^6$, $R^7$, $R^8$, $R^9$ and Rill of the general formulas [1] to [8] have a carbon number of 2 to 16, particularly preferably 4 to 14 and much more preferably 6 to 14, since a more excellent water repellency is imparted thereby. Additionally, the hydrocarbon group the hydrogen elements of which may partially or entirely be substituted with a fluorine element(s) is preferably alkyl group and particularly preferably a straight-chained alkyl group. If the hydrocarbon group is a straight-chained alkyl group, hydrophobic moieties of the protecting film forming agent tend to be arranged perpendicularly to the surface of the protecting film at the time of forming the protecting film so as to enhance a water-repellency-imparting effect, which is therefore further preferable. Moreover, $R^1$, $R^3$, $R^5$, $R^6$, $R^7$, $R^8$, $R^9$ and $R^{10}$ of the general formulas [1] to [8] bring about a far better water repellency, so that these are preferably hydrocarbon groups whose hydrogen elements are partially or entirely be substituted with a fluorine element(s).

The protecting film forming agent may exist in the form of a salt compound of a compound represented by the general formula [1], [2], [4], [5] or [7], for example, in the form of a salt such as ammonium salt, amine salt and the like. In addition, the protecting film forming agent may exist in the form of a salt compound of a compound represented by the general formula [3], [6] or [8], for example, in the form of a salt such as carbonate, hydrochloride, sulfate, phosphate and the like.

Furthermore, the protecting film forming agent contained in the liquid chemical for forming a protecting film preferably has a concentration of 0.0005 to 2 mass % relative to the total quantity of 100 mass % of the liquid chemical. A concentration of smaller than 0.0005 mass % tends to make the water-repellency-imparting effect insufficient, while that of larger than 2 mass % tends to be insoluble in a solvent to be used for the liquid chemical. A concentration of 0.001 to 1 mass % is more preferable, and 0.0015 to 0.8 mass % is particularly preferable.

As the solvent used for the liquid chemical for forming a protecting film, there can be suitably adopted water, an organic solvent, and a mixture liquid of water and an organic solvent. Preferable examples of the organic solvent are hydrocarbons, esters, ethers, ketones, halogen element-containing solvents, sulfoxide-based solvents, lactone-based solvents, carbonate-based solvents, alcohols, polyalcohol derivatives, nitrogen element-containing solvents, and a mixture liquid of these.

As concrete examples of the organic solvent, it is possible to cite those discussed in the first aspect of the present invention.

Additionally, it is preferable to use a nonflammable one as a part or the entire of the solvent since the liquid chemical for forming a protecting film becomes nonflammable or increases in flash point thereby reducing the risk of the liquid chemical. Most of the halogen element-containing solvents are nonflammable, so that such a halogen element-containing nonflammable solvent can be preferably used as a nonflammable organic solvent. Also, water can preferably be used as a nonflammable solvent, too.

Additionally, most of the polyalcohol derivatives have a high flash point and therefore it is preferable to use these solvents because the risk of the liquid chemical for forming a protecting film can be reduced.

With consideration given to a protecting film forming ability that the liquid chemical for forming a protecting film has, it is preferable to use hydrocarbons, esters, ethers, ketones, polyalcohol derivatives having no hydroxyl group, water or a mixture liquid thereof, as the solvent. Additionally, in consideration of substitutability with a water-based cleaning liquid, it is preferable to use polyalcohol derivatives having no hydroxyl group, water or a mixture liquid thereof. Additionally, alcohols and the polyalcohol derivatives having hydroxyl group provide the protecting film forming agent with an excellent solubility. When such a solvent is used as the solvent contained in the liquid chemical, therefore, the protecting film forming agent can be dissolved at a high concentration. Since a liquid chemical having a good protecting film forming ability can be thus easily obtained, such a solvent may be used as the solvent contained in the liquid chemical.

Additionally, in order to accelerate the formation of the protecting film by virtue of the protecting film forming agent, a catalyst may be added to the liquid chemical for forming a protecting film. The amount of the addition of the catalyst is preferably 0.01 to 50 mass % relative to the total quantity of 100 mass % of the protecting film forming agent.

When increasing the temperature of the liquid chemical for forming a protecting film, the protecting film can be formed in a shorter time. A temperature at which a uniform protecting film can be readily formed is not lower than 10° C. and lower than the boiling point of the liquid chemical. Particularly, it is preferable to keep a temperature of not lower than 15° C. and not higher than a temperature 10° C. lower than the boiling point of the liquid chemical. It is preferable that the temperature of the liquid chemical is kept at the above-mentioned temperature while the liquid chemical is being retained at least in the recessed portions of the uneven pattern.

The liquid chemical for forming a protecting film, used in the protecting film forming step is reused in other subsequent treatments for wafer. For example, in the case of the above-mentioned single cleaning style, a liquid chemical having been provided to a wafer and then left the wafer is collected and can be reused in other subsequent wafer treatments. Meanwhile, in the case of the above-mentioned batch style, a batch of liquid chemical treatment is conducted in a treatment bath and then a wafer is taken out thereof; thereafter, a liquid chemical left in the treatment bath can be used for a subsequent batch.

Incidentally, a liquid chemical to be reused may be used upon being partially discarded or may be used with the addition of an additional liquid chemical. Furthermore, the reusable liquid chemical may be used upon performing a purification operation such as: removal of water molecules by an absorbent, i.e. a molecular sieve and the like, distillation and the like; removal of metal impurities, for example, by an ion-exchange resin, distillation and the like; removal of contaminants including particles etc., for example, by filtration; and the like.

After the water repellent protecting film forming step, a liquid that remains in the recessed portions of the wafer is removed by drying (hereinafter, this drying operation is sometimes referred to as "a drying step").

After the protecting film forming step, the liquid chemical retained at least in the recessed portions of the uneven pattern may be substituted with a cleaning liquid different from the above-mentioned liquid chemical (hereinafter, this cleaning liquid different from the above-mentioned liquid chemical is sometimes referred to as "a cleaning liquid B") (hereinafter, this step is sometimes referred to as "a subsequent cleaning step"), and then may be brought into a drying step. Examples of the cleaning liquid B are: a water-based cleaning liquid, an organic solvent; a mixture of the water-based cleaning liquid and the organic solvent; those into which at least one kind of acid, alkali and a surfactant is mixed; these in which the protecting film forming agent used for the liquid chemical for forming a protecting film is contained at a concentration lower than that of the liquid chemical; and the like. From the viewpoint of removing particles and metal impurities, it is more preferable that the cleaning liquid B is water, an organic solvent or a mixture of water and the organic solvent.

Furthermore, in the subsequent cleaning step, substitution with the cleaning liquid B may be conducted twice or more. More specifically, the liquid chemical for forming a protecting film may be substituted with a first kind of cleaning liquid B and the first kind of cleaning liquid B may successively be substituted with two or more kinds of cleaning liquids B different from the above-mentioned cleaning liquid B, followed by the drying step.

The organic solvent, which serves as one of the preferable examples of the cleaning liquid B, are exemplified by hydrocarbons, esters, ethers, ketones, halogen element-containing solvents, sulfoxide-based solvents, lactone-based solvents, carbonate-based solvents, alcohols, polyalcohol derivatives, nitrogen element-containing solvents and the like.

In addition, the protecting film formed on the wafer surface by the liquid chemical of the present invention is particularly preferable when an organic solvent is used as the cleaning liquid B since reduction of the water repellency by the subsequent cleaning step is little.

There is shown in FIG. 4 a schematic view showing a state where a liquid is retained in the recessed portions 4 provided with water repellency by the liquid chemical for forming a protecting film. The wafer as shown in the schematic view of FIG. 4 shows a part of the a-a' cross section in FIG. 1. The surface formed having the uneven pattern is coated with a protecting film 10 by the liquid chemical thereby being provided with water repellency. Furthermore, the protecting film 10 is retained on the wafer surface even when the liquid 9 is removed from the uneven pattern.

When the protecting film 10 is formed at least on the surfaces of the recessed portions of the uneven pattern of the wafer by the liquid chemical for forming a protecting film, a contact angle of from 50 to 130° is preferable on the assumption that water is retained on the surfaces, because the pattern collapse becomes difficult to occur thereby. It is therefore particularly preferable that the contact angle is 65 to 115° because the pattern collapse becomes further difficult to occur.

Then, as discussed in the drying step, there is conducted a step of removing a liquid from the uneven pattern by drying, the liquid being retained in the recessed portions 4 on which the protecting film is formed by the liquid chemical. At this time, the liquid retained in the recessed portions may be the liquid chemical used in the protecting film forming step, the cleaning liquid B used in the subsequent cleaning step, or a mixture liquid of these. The mixture liquid is one in which the protecting film forming agent is contained in the liquid chemical for forming a protecting film at a concentration lower than that of the liquid chemical, and may be a liquid which is on the way to substitution of the liquid chemical with the cleaning liquid B, or a mixture liquid obtained by previously mixing the protecting film forming agent with the cleaning liquid B. In view of the cleanliness of the wafer, there is preferably used water, an organic solvent, or a mixture of water and the organic solvent. Additionally, it is also possible to bring the cleaning liquid B retained on the unevenly patterned surface after once removing liquid from the unevenly patterned surface and to conduct drying thereafter.

Incidentally, in a case of performing a cleaning treatment after a surface treatment with the liquid chemical (i.e. in a case of performing the subsequent cleaning step), a time for this step, i.e. a time to retain the cleaning liquid B is not shorter than 5 seconds, preferably not shorter than 10 seconds, more preferably not shorter than 20 seconds from the viewpoint of removing particles and impurities from the unevenly patterned surface. In view of the effect of maintaining a water repellent performance of the protecting film formed on the unevenly patterned surface, the use of an organic solvent as the cleaning liquid B is preferable because the water repellency of the wafer surface is maintained even after conducting the subsequent cleaning step. On the other hand, a too long time for the subsequent cleaning step can reduce the productivity, and therefore the time is preferably within 15 minutes.

Furthermore, since water has a large contact angle to the surface obtained after forming a protecting film, water is able to easily decrease the capillary force which is to act on the recessed portions, which results in a lesser occurrence of the pattern collapse at the time of removing the cleaning liquid B. It is therefore water may be used as the cleaning liquid B.

In the drying step, a liquid retained on the uneven pattern is removed by drying. The drying is preferably conducted by a conventionally known drying method such as spin drying, IPA (2-propanol) steam drying, Marangoni drying, heating drying, blowing drying, warm air drying, vacuum drying and the like.

After the drying step, the protecting film that remains on the wafer surface is removed (hereinafter, this removing operation is sometimes reffered to as "a film removing step"). In the case of removing the water repellent protecting film, it is effective to cleave C—C bond and C—F bond in the water repellent protecting film. A method therefor is not particularly limited so long as it is possible to cleave the above-mentioned bonds but exemplified by: irradiating the wafer surface with light; heating the wafer; exposing the wafer to ozone; irradiating the wafer surface with plasma; subjecting the wafer surface to corona discharge; and the like.

In the case of removing the protecting film by light irradiation, it is preferable to conduct an irradiation with ultraviolet rays having a wavelength of shorter than 340 nm and 240 nm (corresponding to bond energies of C—C bond and C—F bond in the protecting film, i.e., 83 kcal/mol and 116 kcal/mol, respectively). As the light source therefor, there is used a metal halide lamp, a low-pressure mercury lamp, a high-pressure mercury lamp, an excimer lamp, a carbon arc or the like. In the case of the metal halide lamp, the intensity of the ultraviolet irradiation is preferably not less than 100 mW/cm$^2$, particularly preferably not less than 200 mW/cm$^2$, as a measurement value obtained by the illuminance meter (Intensity meter UM-10 produced by Konica Minolta Sensing, Inc., Light-Receptor UM-360 [Peak sensitivity wavelength: 365 nm, Measured wavelength range: 310 to 400 nm]). Incidentally, an irradiation intensity of less than 100 mW/cm$^2$ takes a long time to remove the protecting film. Additionally, in the case of the low-pressure mercury lamp, the ultraviolet irradiation is performed with shorter wavelengths so that removal of the protecting film is achieved in a short time even if the intensity is low. This is therefore preferable.

Additionally, in the case of removing the protecting film by light irradiation, it is particularly preferable to generate ozone in parallel with decomposing the components of the protecting film by ultraviolet rays and then to induce oxidation-volatilization of the components of the protecting film by the ozone, since a treatment time is saved thereby. As the light source therefor, the low-pressure mercury lamp, the excimer lamp or the like is used. Moreover, the wafer may be heated while being subjected to light irradiation.

In the case of heating the wafer, heating of the wafer is conducted at 400 to 1000° C., preferably at 500 to 900° C. The heating time is preferably kept from 10 seconds to 60 minutes, more preferably from 30 seconds to 10 minutes. Additionally, this step may be conducted in combination with ozone exposure, plasma irradiation, corona discharge or the like. Furthermore, the light irradiation may be conducted while heating the wafer.

As the method for removing the protecting film by heating, there are a method of bringing a wafer into contact with a heat source, a method of bringing a wafer into a heated atmosphere such as a heat treatment furnace, and the like. The method of bringing a wafer into a heated atmosphere can easily and uniformly provide the wafer surface with energy for removing the protecting film even in a case where two or more wafers are subjected to a treatment. This method is operationally convenient, achieves the treatment within a short period of time and has high treatment ability. Therefore, this is an industrially advantageous method.

In the case of exposing the wafer to ozone, it is preferable to expose the wafer surface to ozone generated by ultraviolet irradiation using the low-pressure mercury lamp, low-temperature discharge using high voltages or the like. The wafer may be irradiated with light or heated while being exposed to ozone.

In the film removing step, the protecting film formed on the wafer surface can be efficiently removed by combining the above-mentioned light irradiation, heating, ozone exposure, plasma irradiation and corona discharge.

EXAMPLES

A technique of making a wafer surface into a surface having an uneven pattern and a technique of substituting a cleaning liquid retained at least in recessed portions of the uneven pattern with other cleaning liquid have been variously studied as discussed in other literatures and the like, and have already been established. Accordingly, in the present invention, evaluations concerning a liquid chemical for forming a protecting film were mainly performed. Additionally, as apparent from the following equation, a pattern collapse greatly depends on the contact angle of a cleaning liquid to the wafer surface, i.e. the contact angle of a liquid drop and on the surface tension of the cleaning liquid.

$$P=2\times\gamma\times\cos\theta/S$$

(In the equation, $\gamma$ represents the surface tension of a liquid retained in the recessed portions, $\theta$ represents the contact angle between the liquid retained in the recessed portions and the surfaces of the recessed portions, and S represents the widths of the recessed portions.)

In a case of a cleaning liquid retained in recessed portions 4 of an uneven pattern 2, the contact angle of a liquid drop and the capillary force acting on the recessed portions (which force is regarded as being equal to the pattern collapse) are in correlation with each other, so that it is also possible to derive the capillary force from the equation and the evaluations made on the contact angle of the liquid drop to a protecting film 10. In Examples, water, which is representative of a water-based cleaning liquid, was used as the cleaning liquid. On the assumption that water is retained on the surface of the protecting film, the contact angle is preferably from 50 to 130° because the pattern collapse becomes difficult to occur, and more preferably from 65 to 115° because the pattern collapse becomes further difficult to occur.

However, in the case of a wafer having an unevenly patterned surface, it is not possible to exactly evaluate the contact angle of the protecting film 10 itself formed on the unevenly patterned surface.

An evaluation of the contact angle of waterdrop is conducted by dropping several microliters of waterdrop on a surface of a sample (a substrate) and then by measuring an angle formed between the waterdrop and the substrate surface, as discussed in JIS R 3257 (Testing method of wettability of glass substrate surface). However, in the case of the wafer having a pattern, the contact angle is enormously large. This is because Wenzel's effect or Cassie's effect is caused so that an apparent contact angle of the waterdrop is increased under the influence of a surface shape (roughness) of the substrate upon the contact angle.

In view of the above, in Example I that relates to the first aspect of the present invention, the liquid chemical is supplied onto a wafer having a smooth surface to form a protecting film thereon, the protecting film being regarded as the protecting film 10 formed on the surface of a wafer 1 having at its surface an uneven pattern 2, thereby performing various evaluations. In Example I, there were used as the wafer having a smooth surface: "a wafer having a titanium nitride film" formed of a silicon wafer having a smooth surface and having a titanium nitride film thereon (this wafer is indicated in Tables by TiN); and "a wafer having a ruthenium film" formed of a silicon wafer having a smooth surface and having a ruthenium film thereon (this wafer is indicated in Tables by Ru).

Example I

Details will be discussed below. Hereinafter, there will be discussed: a method for evaluating a wafer to which a liquid chemical for forming a protecting film is supplied; preparation of the liquid chemical for forming a protecting film; and results of evaluation made after supplying the liquid chemical for forming a protecting film to the wafer.

[Method for Evaluating Wafer to which Liquid Chemical for Forming Protecting Film is Provided]

As a method for evaluating a wafer to which a liquid chemical for forming a protecting film is provided, the following evaluations (1) to (3) were performed.

(1) Evaluation of Contact Angle of Protecting Film Formed on Wafer Surface

About 2 µl of pure water was dropped on a surface of a wafer on which a protecting film was formed, followed by measuring an angle (contact angle) formed between the waterdrop and the wafer surface by using a contact angle meter (produced by Kyowa Interface Science Co., Ltd.: CA-X Model). In this evaluation, a wafer whose protecting film has a contact angle within a range of from 50 to 130° was classified as an acceptable one.

(2) Removability of Protecting Film

Under the following conditions, a sample was irradiated with UV rays from a metal halide lamp for 2 hours, upon which an evaluation of removability of the protecting film at the film removing step was made. A sample on which waterdrop had a contact angle of not larger than 30° after the irradiation was classified as acceptable one.

Lamp: M015-L312 produced by EYE GRAPHICS CO., LTD. (Intensity: 1.5 kW)
Illuminance: 128 mW/cm$^2$ as a measurement value obtained under the following conditions
Measuring Apparatus: Ultraviolet Intensity Meter (UM-10 produced by Konica Minolta Sensing, Inc.)
Light-Receptor: UM-360 (Light-Receptive Wavelength: 310-400 nm, Peak Wavelength: 365 nm)
Measuring Mode: Irradiance Measurement (3) Evaluation of Surface Smoothness of Wafer after Removing Protecting Film The surface was observed by atomic force microscope (produced by Seiko Instruments Inc.: SPI3700, 2.5 micrometer square scan). Then, there was obtained a difference ΔRa (nm) in the centerline average surface roughness Ra (nm) of the surface of the wafer between before and after the cleaning. Incidentally, Ra is a three-dimensionally enlarged one obtained by applying the centerline average roughness defined by JIS B 0601 to a measured surface and is calculated as "an average value of absolute values of deviation from standard surface to designated surface" from the following equation.

$$Ra = \frac{1}{S_0} \int_{Y_T}^{Y_B} \int_{X_L}^{X_R} |F(X, Y) - Z_0| \, dX \, dY$$

where $X_L$ and $X_R$ and $Y_B$ and $Y_T$ represent a measuring range in the X coordinate and the Y coordinate, respectively. $S_0$ represents an area on the assumption that the measured surface is ideally flat, and is a value obtained by $(X_R - X_L) \times (Y_B - Y_T)$. Additionally, F(X,Y) represents the height at a measured point (X,Y). $Z_0$ represents the average height within the measured surface.

The Ra value of the wafer surface before the protecting film was formed thereon and the Ra value of the wafer surface after the protecting film was removed therefrom were measured. If a difference between them (ΔRa) was within ±1 nm, the wafer surface was regarded as not being eroded by the cleaning and as not leaving residues of the protecting film thereon, and therefore classified as an acceptable one.

Example I-1

(1) Preparation of Liquid Chemical for Forming Protecting Film

A mixture of: 0.002 g of octadecylphosphonic acid [$C_{18}H_{37}P(O)(OH)_2$] that serves as a water repellent protecting film forming agent; and 90 g of water and 9.998 g of propylene glycol monomethyl ether acetate (hereinafter referred to as "PGMEA") both of which serve as a solvent was stirred for 18 hours thereby obtaining a liquid chemical for forming a protecting film, the liquid chemical having the concentration of the protecting film forming agent (hereinafter referred to as "a protecting film forming agent concentration") of 20 mass ppm relative to the total quantity of the liquid chemical for forming a protecting film and the concentration of water (hereinafter referred to as "a water concentration") of 90 mass % relative to the total quantity of the solvent contained in the liquid chemical for forming a protecting film.

(2) Cleaning of Wafer Having Titanium Nitride Film

As a pretreatment step 2, a wafer having a smooth titanium nitride film (a silicon wafer formed having on its surface a titanium nitride layer of 50 nm thickness) was immersed in 1 mass % aqueous hydrogen peroxide for 1 minute, and then immersed in pure water for 1 minute. Furthermore, as a pretreatment step 3, the wafer was immersed in isopropyl alcohol (hereinafter referred to as "iPA") for 1 minute.

(3) Surface Treatment of Surface of Wafer Having Titanium Nitride Film, Using Liquid Chemical for Forming Protecting Film As a protecting film forming step, the wafer having the titanium nitride film was immersed in the liquid chemical for forming a protecting film at 20° C. for 10 minutes, the liquid chemical having been prepared in the above "(1) Preparation of Liquid Chemical for forming Protecting Film" section, thereby forming a protecting film on the wafer surface. Thereafter, the wafer having the titanium nitride film was immersed in iPA for 1 minute, as a subsequent cleaning step. Then, as a drying step, the wafer having the titanium nitride film was taken out of iPA, followed by spraying air thereon to remove iPA from the surface.

As a result of evaluating the obtained wafer having the titanium nitride film in a manner discussed in the above [Method for Evaluating Wafer to which Liquid Chemical for forming Protecting Film is provided] section, a wafer in which an initial contact angle before the surface treatment was smaller than 10° was confirmed to have a contact angle of 106° after the surface treatment, as shown in Table 1. With this, it was confirmed that a water-repellency-imparting effect was excellently exhibited. Additionally, the contact angle after UV irradiation was smaller than 10°, which means that removal of the protecting film was achieved. Furthermore, the ΔRa value of the wafer after UV irradiation was within ±0.5 nm, with which it was confirmed that the wafer was not eroded at the time of cleaning and that residues of the protecting film did not remain after UV irradiation.

TABLE 1

| | Liquid chemical for Forming Protecting Film | | | | | Protecting Film Forming Step | |
|---|---|---|---|---|---|---|---|
| | | Protecting Film Forming Agent Concentration [mass ppm] | Water Concentration [mass %] | Solvent Other Than Water | Wafer | Temperature [° C.] | Time [min] |
| | Protecting Film Forming Agent | | | | | | |
| Example I-1 | $C_{18}H_{37}P(O)(OH)_2$ | 20 | 90 | PGMEA | TiN | 20 | 10 |
| Example I-2 | $C_{12}H_{25}P(O)(OH)_2$ | 20 | 90 | PGMEA | TiN | 20 | 10 |
| Example I-3 | $C_{12}H_{25}P(O)(OH)_2$ | 20 | 90 | iPA | TiN | 20 | 10 |
| Example I-4 | $C_{12}H_{25}P(O)(OH)_2$ | 20 | 100 | — | TiN | 20 | 10 |
| Example I-5 | $C_{10}H_{21}P(O)(OH)_2$ | 50 | 90 | PGMEA | TiN | 20 | 10 |
| Example I-6 | $C_{10}H_{21}P(O)(OH)_2$ | 50 | 90 | iPA | TiN | 20 | 10 |
| Example I-7 | $C_{10}H_{21}P(O)(OH)_2$ | 50 | 100 | — | TiN | 20 | 10 |
| Example I-8 | $C_{10}H_{21}P(O)(OH)_2$ | 50 | 100 | — | TiN | 20 | 10 |
| Example I-9 | $C_8H_{17}P(O)(OH)_2$ | 300 | 90 | PGMEA | TiN | 20 | 10 |
| Example I-10 | $C_8H_{17}P(O)(OH)_2$ | 300 | 90 | iPA | TiN | 20 | 10 |
| Example I-11 | $C_8H_{17}P(O)(OH)_2$ | 300 | 100 | — | TiN | 20 | 10 |
| Example I-12 | $C_8H_{17}P(O)(OH)_2$ | 300 | 100 | — | TiN | 20 | 10 |
| Example I-13 | $C_8H_{17}P(O)(OH)_2$ | 300 | 100 | — | TiN | 70 | 10 |
| Example I-14 | $C_8H_{17}P(O)(OH)_2$ | 500 | 90 | DGEEA | TiN | 20 | 10 |
| Example I-15 | $C_8H_{17}P(O)(OH)_2$ | 500 | 90 | iPA | TiN | 20 | 10 |
| Example I-16 | $C_8H_{17}P(O)(OH)_2$ | 500 | 100 | — | TiN | 20 | 10 |
| Example I-17 | $C_8H_{17}P(O)(OH)_2$ | 1000 | 90 | PGMEA | TiN | 20 | 10 |
| Example I-18 | $C_8H_{17}P(O)(OH)_2$ | 1000 | 90 | DGEEA | TiN | 20 | 10 |
| Example I-19 | $C_8H_{17}P(O)(OH)_2$ | 1000 | 90 | iPA | TiN | 20 | 10 |
| Example I-20 | $C_8H_{17}P(O)(OH)_2$ | 1000 | 100 | — | TiN | 20 | 10 |
| Example I-21 | $C_8H_{17}P(O)(OH)_2$ | 1000 | 100 | — | TiN | 70 | 10 |
| Example I-22 | $C_8H_{17}P(O)(OH)_2$ | 1500 | 90 | iPA | TiN | 20 | 10 |
| Example I-23 | $C_8H_{17}P(O)(OH)_2$ | 1500 | 90 | iPA | TiN | 20 | 10 |
| Example I-24 | $C_6F_{13}$—$C_2H_4$—$P(O)(OH)_2$ | 100 | 90 | iPA | TiN | 20 | 10 |
| Example I-25 | $C_6F_{13}$—$C_2H_4$—$P(O)(OH)_2$ | 100 | 100 | — | TiN | 20 | 10 |
| Example I-26 | $C_6F_{13}$—$C_2H_4$—$P(O)(OH)_2$ | 100 | 100 | — | TiN | 70 | 10 |
| Example I-27 | $C_6F_{13}$—$C_2H_4$—$P(O)(OH)_2$ | 100 | 100 | — | TiN | 20 | 10 |
| Example I-28 | $C_6F_{13}$—$C_2H_4$—$P(O)(OH)_2$ | 100 | 100 | — | TiN | 70 | 10 |
| Example I-29 | $C_6F_{13}$—$C_2H_4$—$P(O)(OH)_2$ | 300 | 80 | DGEEA | TiN | 20 | 10 |
| Example I-30 | $C_6F_{13}$—$C_2H_4$—$P(O)(OH)_2$ | 300 | 80 | PGME | TiN | 20 | 10 |
| Example I-31 | $C_6F_{13}$—$C_2H_4$—$P(O)(OH)_2$ | 300 | 80 | iPA | TiN | 20 | 10 |
| Example I-32 | $C_6F_{13}$—$C_2H_4$—$P(O)(OH)_2$ | 300 | 80 | iPA | TiN | 20 | 10 |
| Example I-33 | $C_6F_{13}$—$C_2H_4$—$P(O)(OH)_2$ | 300 | 80 | iPA | TiN | 70 | 10 |
| Example I-34 | $C_6F_{13}$—$C_2H_4$—$P(O)(OH)_2$ | 300 | 100 | — | TiN | 20 | 10 |
| Example I-35 | $C_6F_{13}$—$C_2H_4$—$P(O)(OH)_2$ | 500 | 70 | DGEEA | TiN | 20 | 10 |
| Example I-36 | $C_6F_{13}$—$C_2H_4$—$P(O)(OH)_2$ | 500 | 70 | PGME | TiN | 20 | 10 |
| Example I-37 | $C_6F_{13}$—$C_2H_4$—$P(O)(OH)_2$ | 500 | 70 | iPA | TiN | 20 | 10 |

| | Subsequent Cleaning Step | | Evaluation Result | | | |
|---|---|---|---|---|---|---|
| | Cleaning Liquid for Subsequent Cleaning Step | Time [min] | Initial Contact Angle [°] | Contact Angle after Surface Treatment [°] | Removability of Protecting Film (Contact Angle [°]) | Surface Smoothness (Δ Ra [nm]) |
| Example I-1 | iPA | 1 | <10 | 106 | <10 | Within ±0.5 |
| Example I-2 | iPA | 1 | <10 | 98 | <10 | Within ±0.5 |
| Example I-3 | iPA | 1 | <10 | 90 | <10 | Within ±0.5 |
| Example I-4 | iPA | 1 | <10 | 98 | <10 | Within ±0.5 |
| Example I-5 | iPA | 1 | <10 | 96 | <10 | Within ±0.5 |
| Example I-6 | iPA | 1 | <10 | 84 | <10 | Within ±0.5 |
| Example I-7 | iPA | 1 | <10 | 96 | <10 | Within ±0.5 |
| Example I-8 | — | — | <10 | 98 | <10 | Within ±0.5 |
| Example I-9 | iPA | 1 | <10 | 94 | <10 | Within ±0.5 |
| Example I-10 | iPA | 1 | <10 | 82 | <10 | Within ±0.5 |
| Example I-11 | iPA | 1 | <10 | 94 | <10 | Within ±0.5 |
| Example I-12 | — | — | <10 | 94 | <10 | Within ±0.5 |
| Example I-13 | — | — | <10 | 98 | <10 | Within ±0.5 |
| Example I-14 | iPA | 1 | <10 | 98 | <10 | Within ±0.5 |
| Example I-15 | iPA | 1 | <10 | 90 | <10 | Within ±0.5 |
| Example I-16 | — | — | <10 | 100 | <10 | Within ±0.5 |
| Example I-17 | iPA | 1 | <10 | 100 | <10 | Within ±0.5 |
| Example I-18 | iPA | 1 | <10 | 100 | <10 | Within ±0.5 |
| Example I-19 | iPA | 1 | <10 | 92 | <10 | Within ±0.5 |
| Example I-20 | — | — | <10 | 102 | <10 | Within ±0.5 |
| Example I-21 | — | — | <10 | 104 | <10 | Within ±0.5 |
| Example I-22 | iPA | 1 | <10 | 94 | <10 | Within ±0.5 |
| Example I-23 | — | — | <10 | 94 | <10 | Within ±0.5 |
| Example I-24 | iPA | 1 | <10 | 108 | <10 | Within ±0.5 |

TABLE 1-continued

| | | | | | | |
|---|---|---|---|---|---|---|
| Example I-25 | iPA | 1 | <10 | 108 | <10 | Within ±0.5 |
| Example I-26 | iPA | 1 | <10 | 110 | <10 | Within ±0.5 |
| Example I-27 | — | — | <10 | 108 | <10 | Within ±0.5 |
| Example I-28 | — | — | <10 | 110 | <10 | Within ±0.5 |
| Example I-29 | iPA | 1 | <10 | 112 | <10 | Within ±0.5 |
| Example I-30 | iPA | 1 | <10 | 112 | <10 | Within ±0.5 |
| Example I-31 | iPA | 1 | <10 | 110 | <10 | Within ±0.5 |
| Example I-32 | — | — | <10 | 110 | <10 | Within ±0.5 |
| Example I-33 | — | — | <10 | 112 | <10 | Within ±0.5 |
| Example I-34 | iPA | 1 | <10 | 112 | <10 | Within ±0.5 |
| Example I-35 | iPA | 1 | <10 | 112 | <10 | Within ±0.5 |
| Example I-36 | iPA | 1 | <10 | 112 | <10 | Within ±0.5 |
| Example I-37 | iPA | 1 | <10 | 110 | <10 | Within ±0.5 |

Examples I-2 to I-53

Upon suitably modifying the conditions employed in Example I-1 (i.e., the protecting film forming agent, the protecting film forming agent concentration, the solvent for the liquid chemical for forming a protecting film, the temperature of the liquid chemical for forming a protecting film, and the subsequent cleaning step), a surface treatment was conducted on wafers, followed by evaluation of these. The results are shown in Tables 1 and 2. Incidentally, Examples I-8, I-12, I-13, I-16, I-20, I-21, I-23, I-27, I-28, I-32, I-33, I-38, I-39, I-43, I-44, I-46, I-47 and I-49 to I-53 did not undergo the subsequent cleaning step. In other words, the wafers having a titanium nitride film were taken out of the liquid chemical after the water repellent protecting film forming step, followed by spraying air thereon to remove the liquid chemical from the surface.

Incidentally, in the Tables, "$C_{12}H_{25}P(O)(OH)_2$" means dodecylphosphonic acid. "$C_{10}H_{21}P(O)(OH)_2$" means decylphosphonic acid. "$C_8H_{17}P(O)(OH)_2$" means octylphosphonic acid. "$C_6F_{13}—C_2H_4—P(O)(OH)_2$" means perfluorohexylethylphosphonic acid. "$C_6H_3P(O)(OH)_2$" means hexylphosphonic acid. "$C_4H_9P(O)(OH)_2$" means butylphosphonic acid. "$C_6H_5P(O)(OH)_2$" means phenylphosphonic acid. Additionally, "DGEEA" means cliethylene glycol monoethyl ether acetate. "PGME" means propylene glycol monomethyl ether.

TABLE 2

| | Liquid chemical for Forming Protecting Film | | | | | Protecting Film Forming Step | |
|---|---|---|---|---|---|---|---|
| | Protecting Film Forming Agent | Protecting Film Forming Agent Concentration [mass ppm] | Water Concentration [mass %] | Solvent Other Than Water | Wafer | Temperature [° C.] | Time [min] |
| Example I-38 | $C_6F_{13}—C_2H_4—P(O)(OH)_2$ | 500 | 70 | iPA | TiN | 20 | 10 |
| Example I-39 | $C_6F_{13}—C_2H_4—P(O)(OH)_2$ | 500 | 70 | iPA | TiN | 70 | 10 |
| Example I-40 | $C_6F_{13}—C_2H_4—P(O)(OH)_2$ | 1000 | 70 | DGEEA | TiN | 20 | 10 |
| Example I-41 | $C_6F_{13}—C_2H_4—P(O)(OH)_2$ | 1000 | 70 | PGME | TiN | 20 | 10 |
| Example I-42 | $C_6F_{13}—C_2H_4—P(O)(OH)_2$ | 1000 | 70 | iPA | TiN | 20 | 10 |
| Example I-43 | $C_6F_{13}—C_2H_4—P(O)(OH)_2$ | 1000 | 70 | iPA | TiN | 20 | 10 |
| Example I-44 | $C_6F_{13}—C_2H_4—P(O)(OH)_2$ | 1000 | 70 | iPA | TiN | 70 | 10 |
| Example I-45 | $C_6F_{13}—C_2H_4—P(O)(OH)_2$ | 1500 | 70 | iPA | TiN | 20 | 10 |
| Example I-46 | $C_6F_{13}—C_2H_4—P(O)(OH)_2$ | 1500 | 70 | iPA | TiN | 20 | 10 |
| Example I-47 | $C_6F_{13}—C_2H_4—P(O)(OH)_2$ | 1500 | 70 | iPA | TiN | 70 | 10 |
| Example I-48 | $C_6H_{13}P(O)(OH)_2$ | 500 | 100 | — | TiN | 20 | 10 |
| Example I-49 | $C_6H_{13}P(O)(OH)_2$ | 500 | 100 | — | TiN | 70 | 10 |
| Example I-50 | $C_4H_9P(O)(OH)_2$ | 500 | 100 | — | TiN | 20 | 10 |
| Example I-51 | $C_4H_9P(O)(OH)_2$ | 500 | 100 | — | TiN | 70 | 10 |
| Example I-52 | $C_6H_6P(O)(OH)_2$ | 1000 | 100 | — | TiN | 20 | 10 |
| Example I-53 | $C_6H_6P(O)(OH)_2$ | 1000 | 100 | — | TiN | 70 | 10 |
| Example I-54 | $C_{18}H_{37}P(O)(OH)_2$ | 20 | 90 | PGMEA | Ru | 20 | 10 |
| Example I-55 | $C_{12}H_{26}P(O)(OH)_2$ | 20 | 100 | — | Ru | 20 | 10 |
| Example I-56 | $C_6F_{13}—C_2H_4—P(O)(OH)_2$ | 100 | 100 | — | Ru | 20 | 10 |
| Example I-57 | $C_6F_{13}—C_2H_4—P(O)(OH)_2$ | 100 | 100 | — | Ru | 70 | 10 |
| Example I-58 | $C_6F_{13}—C_2H_4—P(O)(OH)_2$ | 500 | 70 | iPA | Ru | 20 | 10 |
| Example I-59 | $C_6F_{13}—C_2H_4—P(O)(OH)_2$ | 1000 | 70 | iPA | Ru | 20 | 10 |
| Example I-60 | $C_6F_{13}—C_2H_4—P(O)(OH)_2$ | 1000 | 70 | iPA | Ru | 70 | 10 |
| Example I-61 | $C_6F_{13}—C_2H_4—P(O)(OH)_2$ | 1500 | 70 | iPA | Ru | 20 | 10 |
| Comparative Example I-1 | $(CH_3)_3SiN(CH_3)_2$ | 100 | 50 | DGEEA | TiN | 20 | 10 |
| Comparative Example I-2 | $(CH_3)_3SiN(CH_3)_2$ | 100 | 50 | DGEEA | Ru | 20 | 10 |

TABLE 2-continued

| | Subsequent Cleaning Step | | Evaluation Result | | | |
|---|---|---|---|---|---|---|
| | Cleaning Liquid for Subsequent Cleaning Step | Time [min] | Initial Contact Angle [°] | Contact Angle after Surface Treatment [°] | Removability of Protecting Film (Contact Angle [°]) | Surface Smoothness (Δ Ra [nm]) |
| Example I-38 | — | — | <10 | 110 | <10 | Within ±0.5 |
| Example I-39 | — | — | <10 | 112 | <10 | Within ±0.5 |
| Example I-40 | iPA | 1 | <10 | 112 | <10 | Within ±0.5 |
| Example I-41 | iPA | 1 | <10 | 112 | <10 | Within ±0.5 |
| Example I-42 | iPA | 1 | <10 | 110 | <10 | Within ±0.5 |
| Example I-43 | — | — | <10 | 110 | <10 | Within ±0.5 |
| Example I-44 | — | — | <10 | 112 | <10 | Within ±0.5 |
| Example I-45 | iPA | 1 | <10 | 110 | <10 | Within ±0.5 |
| Example I-46 | — | — | <10 | 110 | <10 | Within ±0.5 |
| Example I-47 | — | — | <10 | 112 | <10 | Within ±0.5 |
| Example I-48 | iPA | 1 | <10 | 88 | <10 | Within ±0.5 |
| Example I-49 | — | — | <10 | 90 | <10 | Within ±0.5 |
| Example I-50 | — | — | <10 | 64 | <10 | Within ±0.5 |
| Example I-51 | — | — | <10 | 70 | <10 | Within ±0.5 |
| Example I-52 | — | — | <10 | 62 | <10 | Within ±0.5 |
| Example I-53 | — | — | <10 | 64 | <10 | Within ±0.5 |
| Example I-54 | iPA | 1 | <10 | 72 | <10 | Within ±0.5 |
| Example I-55 | iPA | 1 | <10 | 64 | <10 | Within ±0.5 |
| Example I-56 | iPA | 1 | <10 | 78 | <10 | Within ±0.5 |
| Example I-57 | iPA | 1 | <10 | 98 | <10 | Within ±0.5 |
| Example I-58 | iPA | 1 | <10 | 80 | <10 | Within ±0.5 |
| Example I-59 | iPA | 1 | <10 | 82 | <10 | Within ±0.5 |
| Example I-60 | iPA | 1 | <10 | 100 | <10 | Within ±0.5 |
| Example I-61 | iPA | 1 | <10 | 84 | <10 | Within ±0.5 |
| Comparative Example I-1 | iPA | 1 | <10 | 10 | — | — |
| Comparative Example I-2 | iPA | 1 | <10 | 16 | — | — |

Example I-54

As a pretreatment step 2, a wafer having a smooth ruthenium film (a silicon wafer formed having on its surface a ruthenium layer of 300 nm thickness) was immersed in 1 mass % aqueous ammonia for 1 minute, and then immersed in pure water for 1 minute. Furthermore, as a pretreatment step 3, the wafer was immersed in iPA for 1 minute. The procedure of Example I-1 was repeated with the exception that a protecting film was formed on the surface of this wafer.

As a result of evaluating the wafer having a smooth ruthenium film on which the protecting film was formed, in a manner discussed in the above [Method for Evaluating Wafer to which Liquid Chemical for forming Protecting Film is provided] section, a wafer in which an initial contact angle before the surface treatment was smaller than 10° was confirmed to have a contact angle of 72° after the surface treatment, as shown in Table 2. With this, it was confirmed that a water-repellency-imparting effect was exhibited. Additionally, the contact angle after UV irradiation was smaller than 10°, which means that removal of the protecting film was achieved. Furthermore, the ΔRa value of the wafer after UV irradiation was within ±0.5 nm, with which it was confirmed that the wafer was not eroded at the time of cleaning and that residues of the protecting film did not remain after UV irradiation.

Examples I-55 to I-61

Upon suitably modifying the conditions employed in Example I-54 (i.e., the protecting film forming agent, the protecting film forming agent concentration, the solvent for the liquid chemical for forming a protecting film, and the temperature of the liquid chemical for forming a protecting film), a surface treatment was conducted on wafers, followed by evaluation of these. The results are shown in Table 2.

Comparative Example I-1

First of all, a mixture of; 0.01 g of N,N-dimethylamino-trimethylsilane [$(CH_3)_3SiN(CH_3)_2$] that is a silane coupling agent and serves as a protecting film forming agent; and 50 g of water and 49.99 g of DGEEA both of which serve as a solvent was stirred for 18 hours thereby obtaining a liquid chemical for forming a protecting film, the liquid chemical having a protecting film forming agent concentration of 100 mass ppm and a water concentration of 50 mass %. Then, cleaning and a surface treatment were conducted on a wafer having a titanium nitride film, by the same method as Example I-1. From the evaluation results as shown in Table 2, it was confirmed that the contact angle after the surface treatment was 10°. The water-repellency-imparting effect was therefore not observed.

Comparative Example I-2

With use of the liquid chemical for forming a protecting film of Comparative Example I-1, cleaning and a surface treatment were conducted on a wafer having a ruthenium film, by the same method as Example I-54. From the evaluation results as shown in Table 2, it was confirmed that the contact angle after the surface treatment was 16°. The water-repellency-imparting effect was therefore not observed.

In Example II that relates to the second aspect of the present invention, the liquid chemical is supplied onto a wafer having a smooth surface to form a protecting film thereon, the protecting film being regarded as the protecting film 10 formed on the surface of a wafer 1 having at its surface an uneven pattern 2, thereby performing various evaluations. In Example II, there were used as the wafer having a smooth surface: "a wafer having a titanium nitride film" formed of a silicon wafer having a smooth surface and having a titanium nitride film thereon (this wafer is indicated in Tables by TiN); "a wafer having a tungsten film" formed of a silicon wafer having a smooth surface and having a tungsten film thereon (this wafer is indicated in Tables by W); and "a wafer having a ruthenium film" formed of a silicon wafer having a smooth surface and having a ruthenium film thereon (this wafer is indicated in Tables by Ru).

Example II

Details will be discussed below. Hereinafter, there will be discussed: a method for evaluating a contact angle of a protecting film formed on a wafer; preparation of a liquid chemical for forming a protecting film; and results of evaluation made after supplying the liquid chemical for forming a protecting film to the wafer.

[Evaluation of Contact Angle of Protecting Film Formed on Wafer Surface]

About 2 μl of pure water was dropped on a surface of a wafer on which a protecting film was formed, followed by measuring an angle (contact angle) formed between the waterdrop and the wafer surface by using a contact angle meter (produced by Kyowa Interface Science Co., Ltd.: CA-X Model). In this evaluation, a wafer whose protecting film has a contact angle within a range of from 50 to 130° was classified as an acceptable one.

Example II-1

(i-1) Preparation of Liquid Chemical for Forming Protecting Film

A mixture of: 0.002 g of octadecylphosphonic acid $[C_{18}H_{37}P(O)(OH)_2]$ that serves as a water repellent protecting film forming agent; and 99.998 g of propylene glycol monomethyl ether acetate (hereinafter referred to as "PGMEA") that serve as a solvent was stirred for 18 hours thereby obtaining a liquid chemical for forming a protecting film, the liquid chemical having the concentration of the protecting film forming agent (hereinafter referred to as "a protecting film forming agent concentration") of 0.002 mass % relative to the total quantity of the liquid chemical for forming a protecting film.

(i-2) Cleaning of Wafer Having Titanium Nitride Film

As a pretreatment step 2, a wafer having a smooth titanium nitride film (a silicon wafer formed having on its surface a titanium nitride layer of 50 nm thickness) was immersed in 1 mass % aqueous hydrogen peroxide for 1 minute, and then immersed in pure water for 1 minute. Furthermore, as a pretreatment step 3, the wafer was immersed in isopropyl alcohol (hereinafter referred to as "iPA") for 1 minute.

(i-3) Surface Treatment of Surface of Wafer Having Titanium Nitride Film, Using Liquid Chemical for Forming Protecting Film As a protecting film forming step, the wafer having the titanium nitride film was immersed in the liquid chemical for forming a protecting film at 20° C. for 10 minutes, the liquid chemical having been prepared in the above "(i-1) Preparation of Liquid Chemical for forming Protecting Film" section, thereby forming a protecting film on the wafer surface. Through this operation, iPA was incorporated into the liquid chemical for forming a protecting film in an amount of 1 mass % relative to the total quantity of the liquid chemical for forming a protecting film. Thereafter, the wafer having the titanium nitride film was immersed in iPA for 10 seconds, as a subsequent cleaning step. Then, as a drying step, the wafer having the titanium nitride film was taken out of iPA, followed by spraying air thereon to remove iPA from the surface.

(i-4) Evaluation of Reusability

An operation where a surface treatment was conducted by immersing a wafer in the liquid chemical for forming a protecting film which liquid chemical had undergone the above [(i-3) Surface Treatment of Surface of Wafer having Titanium Nitride Film, using Liquid Chemical for forming Protecting Film] section was carried out 4 times, the wafer being of a batch different from that used in (i-3). With this, iPA of 5 mass % in total, relative to the total quantity of the liquid chemical for forming a protecting film, was incorporated into the liquid chemical for forming a protecting film.

As a result of evaluating the wafer having the titanium nitride film which wafer was obtained upon being subjected to the surface treatment in the first batch, in a manner discussed in the above [Evaluation of Contact Angle of Protecting Film formed on Wafer Surface] section, a wafer in which an initial contact angle before the surface treatment was smaller than 10° was confirmed to have a contact angle of 106° after the surface treatment, as shown in Table 3. With this, it was confirmed that a water-repellency-imparting effect was excellently exhibited. Additionally, a wafer obtained upon being subjected to the surface treatment in the fifth batch had a contact angle of 106° and therefore confirmed to be reusable.

TABLE 3

| | Liquid Chemical for Forming Protecting Film | | | Solvent | | Contact | |
| --- | --- | --- | --- | --- | --- | --- | --- |
| | Protecting Film Forming Agent | Protecting Film Forming Agent Concentration | | | incorporated into Liquid Chemical for Forming | Contact Angle before | Angle after Surface Treatment [°] | |
| | | [mass %] | Solvent | Wafer | Protecting Film | Treatment [°] | 1st Batch | 5th Batch |
| Example II-1 | $C_{18}H_{37}P(O)(OH)_2$ | 0.002 | PGMEA | TiN | iPA | <10 | 106 | 106 |
| Example II-2 | $C_{12}H_{25}P(O)(OH)_2$ | 0.005 | PGMEA | TiN | Water | <10 | 98 | 98 |
| Example II-3 | $C_{10}H_{21}P(O)(OH)_2$ | 0.005 | PGMEA | TiN | Water | <10 | 96 | 96 |

TABLE 3-continued

| | Liquid Chemical for Forming Protecting Film | | | | Solvent | | Contact | |
|---|---|---|---|---|---|---|---|---|
| | Protecting Film Forming Agent | Protecting Film Forming Agent Concentration [mass %] | Solvent | Wafer | incorporated into Liquid Chemical for Forming Protecting Film | Contact Angle before Treatment [°] | Angle after Surface Treatment [°] | |
| | | | | | | | 1st Batch | 5th Batch |
| Example II-4 | $C_{10}H_{21}P(O)(OH)_2$ | 0.005 | iPA | TiN | Water | <10 | 64 | 64 |
| Example II-5 | $C_{10}H_{21}P(O)(OH)_2$ | 0.005 | Water | TiN | Water | <10 | 96 | 96 |
| Example II-6 | $C_8H_{17}P(O)(OH)_2$ | 0.03 | PGMEA | TiN | Water | <10 | 94 | 94 |
| Example II-7 | $C_8H_{17}P(O)(OH)_2$ | 0.03 | iPA | TiN | Water | <10 | 63 | 63 |
| Example II-8 | $C_8H_{17}P(O)(OH)_2$ | 0.03 | Water | TiN | Water | <10 | 94 | 94 |
| Example II-9 | $C_8H_{17}P(O)(OH)_2$ | 0.03 | PGMEA | TiN | iPA | <10 | 94 | 90 |
| Example II-10 | $C_8H_{17}P(O)(OH)_2$ | 0.03 | iPA | TiN | iPA | <10 | 63 | 63 |
| Example II-11 | $C_8H_{17}P(O)(OH)_2$ | 0.03 | Water | TiN | iPA | <10 | 94 | 94 |
| Example II-12 | $C_6F_{13}$—$C_2H_4$—$P(O)(OH)_2$ | 0.01 | DGEEA | TiN | Water | <10 | 108 | 108 |
| Example II-13 | $C_6F_{13}$—$C_2H_4$—$P(O)(OH)_2$ | 0.01 | PGMEA | TiN | Water | <10 | 108 | 108 |
| Example II-14 | $C_6F_{13}$—$C_2H_4$—$P(O)(OH)_2$ | 0.01 | iPA | TiN | Water | <10 | 96 | 96 |
| Example II-15 | $C_6F_{13}$—$C_2H_4$—$P(O)(OH)_2$ | 0.01 | Water | TiN | Water | <10 | 110 | 110 |
| Example II-16 | $C_6F_{13}$—$C_2H_4$—$P(O)(OH)_2$ | 0.01 | DGEEA | TiN | iPA | <10 | 108 | 102 |
| Example II-17 | $C_6F_{13}$—$C_2H_4$—$P(O)(OH)_2$ | 0.01 | PGMEA | TiN | iPA | <10 | 108 | 104 |
| Example II-18 | $C_6F_{13}$—$C_2H_4$—$P(O)(OH)_2$ | 0.01 | iPA | TiN | iPA | <10 | 96 | 96 |
| Example II-19 | $C_6F_{13}$—$C_2H_4$—$P(O)(OH)_2$ | 0.01 | Water | TiN | iPA | <10 | 110 | 110 |
| Example II-20 | $C_6F_{13}$—$C_2H_4$—$P(O)(OH)_2$ | 0.1 | iPA | TiN | Water | <10 | 100 | 100 |
| Example II-21 | $C_6F_{13}$—$C_2H_4$—$P(O)(OH)_2$ | 0.1 | DGEEA/iPA | TiN | Water | <10 | 104 | 104 |
| Example II-22 | $C_6F_{13}$—$C_2H_4$—$P(O)(OH)_2$ | 0.1 | DGEEA/Water | TiN | Water | <10 | 110 | 110 |
| Example II-23 | $C_6F_{13}$—$C_2H_4$—$P(O)(OH)_2$ | 0.1 | Water/PGME | TiN | Water | <10 | 110 | 110 |
| Example II-24 | $C_6F_{13}$—$C_2H_4$—$P(O)(OH)_2$ | 0.1 | Water/iPA | TiN | Water | <10 | 110 | 110 |
| Example II-25 | $C_6F_{13}$—$C_2H_4$—$P(O)(OH)_2$ | 0.1 | iPA | TiN | iPA | <10 | 110 | 110 |
| Example II-26 | $C_6F_{13}$—$C_2H_4$—$P(O)(OH)_2$ | 0.1 | DGEEA/iPA | TiN | iPA | <10 | 104 | 102 |
| Example II-27 | $C_6F_{13}$—$C_2H_4$—$P(O)(OH)_2$ | 0.1 | DGEEA/Water | TiN | iPA | <10 | 110 | 108 |
| Example II-28 | $C_6F_{13}$—$C_2H_4$—$P(O)(OH)_2$ | 0.1 | Water/PGME | TiN | iPA | <10 | 110 | 108 |
| Example II-29 | $C_6F_{13}$—$C_2H_4$—$P(O)(OH)_2$ | 0.1 | Water/iPA | TiN | iPA | <10 | 110 | 108 |
| Example II-30 | $C_6H_{13}P(O)(OH)_2$ | 0.05 | PGMEA | TiN | Water | <10 | 88 | 88 |
| Example II-31 | $C_6H_{13}P(O)(OH)_2$ | 0.05 | Water | TiN | Water | <10 | 90 | 90 |
| Example II-32 | $C_6H_{13}P(O)(OH)_2$ | 0.05 | PGMEA | TiN | iPA | <10 | 88 | 82 |
| Example II-33 | $C_6H_{13}P(O)(OH)_2$ | 0.05 | Water | TiN | iPA | <10 | 90 | 88 |
| Example II-34 | $C_4H_9P(O)(OH)_2$ | 0.1 | PGMEA | TiN | Water | <10 | 64 | 64 |
| Example II-35 | $C_6H_5P(O)(OH)_2$ | 0.1 | PGMEA | TiN | Water | <10 | 62 | 62 |
| Example II-36 | $C_{14}H_{29}NH_2$ | 0.1 | PGMEA | TiN | iPA | <10 | 88 | 88 |
| Example II-37 | $C_{12}H_{25}NH_2$ | 0.1 | PGMEA | TiN | iPA | <10 | 84 | 84 |
| Example II-38 | $C_6F_{13}$—$C_2H_4$—$NH_2$ | 0.1 | PGMEA | TiN | Water | <10 | 66 | 65 |
| Example II-39 | $C_6F_{13}$—$C_2H_4$—$NH_2$ | 0.1 | PGMEA | TiN | iPA | <10 | 66 | 66 |
| Example II-40 | $C_8H_{17}NH_2$ | 1 | PGMEA | TiN | iPA | <10 | 78 | 78 |

Examples II-2 to II-50

Upon suitably modifying the conditions employed in Example II-1 (i.e., the cleaning liquid of the pretreatment 2 or 3 (the cleaning liquid is indicated in Tables by "a solvent incorporated into the liquid chemical for forming a protecting film". The case where the solvent is water means that the pretreatment step 3 was not performed and that the protecting film forming step was performed after the pretreatment step 2), the protecting film forming agent, the protecting film forming agent concentration, and the solvent for the liquid chemical for forming a protecting film), a surface treatment was conducted on wafers, followed by evaluation of these. The results are shown in Tables 3 and 4.

TABLE 4

| | Liquid Chemical for Forming Protecting Film | | | | Solvent | | Contact | |
|---|---|---|---|---|---|---|---|---|
| | Protecting Film Forming Agent | Protecting Film Forming Agent Concentration [mass %] | Solvent | Wafer | incorporated into Liquid Chemical for Forming Protecting Film | Contact Angle before Treatment [°] | Angle after Surface Treatment [°] | |
| | | | | | | | 1st Batch | 5th Batch |
| Example II-41 | $C_8H_{17}NH_2$ | 1 | iPA | TiN | iPA | <10 | 80 | 80 |
| Example II-42 | $C_8H_{17}NH_2$ | 1 | DGEEA | TiN | iPA | <10 | 80 | 80 |
| Example II-43 | $C_8H_{17}NH_2$ | 1 | DGEEA/Water | TiN | iPA | <10 | 82 | 82 |
| Example II-44 | $C_8H_{17}NH_2$ | 1 | PGMEA | TiN | Water | <10 | 78 | 78 |
| Example II-45 | $C_8H_{17}NH_2$ | 1 | iPA | TiN | Water | <10 | 80 | 80 |
| Example II-46 | $C_8H_{17}NH_2$ | 1 | DGEEA | TiN | Water | <10 | 80 | 80 |
| Example II-47 | $C_8H_{17}NH_2$ | 1 | DGEEA/Water | TiN | Water | <10 | 82 | 82 |
| Example II-48 | $C_{12}H_{25}SH$ | 1 | PGMEA | TiN | iPA | <10 | 78 | 76 |
| Example II-49 | $C_8H_{17}COOH$ | 1 | PGMEA | TiN | iPA | <10 | 76 | 76 |
| Example II-50 | $C_8H_{17}COOH$ | 1 | PGMEA | TiN | Water | <10 | 76 | 76 |
| Example II-51 | $C_{18}H_{37}P(O)(OH)_2$ | 0.002 | PGMEA | W | iPA | <10 | 68 | 68 |
| Example II-52 | $C_{12}H_{25}P(O)(OH)_2$ | 0.005 | PGMEA | W | Water | <10 | 60 | 60 |

TABLE 4-continued

| | Liquid Chemical for Forming Protecting Film | | Solvent | | Contact | |  |
|---|---|---|---|---|---|---|---|
| | Protecting Film Forming Agent | Protecting Film Forming Agent Concentration | | | incorporated into Liquid Chemical for Forming | Contact Angle before Treatment [°] | Angle after Surface Treatment [°] |  |
| | | [mass %] | Solvent | Wafer | Protecting Film | | 1st Batch | 5th Batch |
| Example II-53 | $C_6F_{13}$—$C_2H_4$—$P(O)(OH)_2$ | 0.01 | PGMEA | W | Water | <10 | 70 | 70 |
| Example II-54 | $C_6F_{13}$—$C_2H_4$—$P(O)(OH)_2$ | 0.01 | DGEEA | W | Water | <10 | 70 | 70 |
| Example II-55 | $C_6F_{13}$—$C_2H_4$—$P(O)(OH)_2$ | 0.1 | DGEEA/iPA | W | Water | <10 | 74 | 74 |
| Example II-56 | $C_6F_{13}$—$C_2H_4$—$P(O)(OH)_2$ | 0.01 | PGMEA | W | iPA | <10 | 70 | 68 |
| Example II-57 | $C_6F_{13}$—$C_2H_4$—$P(O)(OH)_2$ | 0.01 | DGEEA | W | iPA | <10 | 70 | 68 |
| Example II-58 | $C_6F_{13}$—$C_2H_4$—$P(O)(OH)_2$ | 0.1 | DGEEA/iPA | W | iPA | <10 | 74 | 74 |
| Example II-59 | $C_{14}H_{29}NH_2$ | 0.1 | PGMEA | W | iPA | <10 | 84 | 84 |
| Example II-60 | $C_{12}H_{25}NH_2$ | 0.1 | PGMEA | W | iPA | <10 | 80 | 80 |
| Example II-61 | $C_6F_{13}$—$C_2H_4$—$NH_2$ | 0.1 | PGMEA | W | Water | <10 | 104 | 106 |
| Example II-62 | $C_6F_{13}$—$C_2H_4$—$NH_2$ | 0.1 | PGMEA | W | iPA | <10 | 104 | 104 |
| Example II-63 | $C_8H_{17}NH_2$ | 1 | PGMEA | W | Water | <10 | 70 | 70 |
| Example II-64 | $C_8H_{17}NH_2$ | 1 | iPA | W | Water | <10 | 70 | 70 |
| Example II-65 | $C_8H_{17}NH_2$ | 1 | DGEEA | W | Water | <10 | 70 | 70 |
| Example II-66 | $C_8H_{17}NH_2$ | 1 | DGEEA/Water | W | Water | <10 | 70 | 70 |
| Example II-67 | $C_8H_{17}NH_2$ | 1 | PGMEA | W | iPA | <10 | 70 | 70 |
| Example II-68 | $C_8H_{17}NH_2$ | 1 | iPA | W | iPA | <10 | 70 | 70 |
| Example II-69 | $C_8H_{17}NH_2$ | 1 | DGEEA | W | iPA | <10 | 68 | 68 |
| Example II-70 | $C_8H_{17}NH_2$ | 1 | DGEEA/Water | W | iPA | <10 | 70 | 70 |
| Example II-71 | $C_{18}H_{37}P(O)(OH)_2$ | 0.002 | PGMEA | Ru | iPA | <10 | 72 | 70 |
| Example II-72 | $C_{12}H_{25}P(O)(OH)_2$ | 0.005 | PGMEA | Ru | Water | <10 | 64 | 62 |
| Example II-73 | $C_6F_{13}$—$C_2H_4$—$P(O)(OH)_2$ | 0.01 | PGMEA | Ru | Water | <10 | 78 | 74 |
| Example II-74 | $C_6F_{13}$—$C_2H_4$—$P(O)(OH)_2$ | 0.01 | DGEEA | Ru | Water | <10 | 78 | 76 |
| Example II-75 | $C_6F_{13}$—$C_2H_4$—$P(O)(OH)_2$ | 0.01 | Water | Ru | Water | <10 | 60 | 60 |
| Example II-76 | $C_6F_{13}$—$C_2H_4$—$P(O)(OH)_2$ | 0.1 | DGEEA/iPA | Ru | Water | <10 | 78 | 76 |
| Example II-77 | $C_6F_{13}$—$C_2H_4$—$P(O)(OH)_2$ | 0.1 | DGEEA/Water | Ru | Water | <10 | 74 | 74 |
| Example II-78 | $C_6F_{13}$—$C_2H_4$—$P(O)(OH)_2$ | 0.1 | Water/iPA | Ru | Water | <10 | 62 | 62 |
| Example II-79 | $C_6F_{13}$—$C_2H_4$—$P(O)(OH)_2$ | 0.01 | PGMEA | Ru | iPA | <10 | 78 | 72 |
| Example II-80 | $C_6F_{13}$—$C_2H_4$—$P(O)(OH)_2$ | 0.01 | DGEEA | Ru | iPA | <10 | 78 | 78 |

Incidentally, in the Tables, "$C_{12}H_{25}P(O)(OH)_2$" means dodecylphosphonic acid. "$C_{10}H_{21}P(O)(OH)_2$" means decylphosphonic acid. "$C_8H_{17}P(O)(OH)_2$" means octylphosphonic acid. "$C_6F_{13}$—$C_2H_4$—$P(O)(OH)_2$" means perfluorohexylethylphosphonic acid. "$C_6H_{13}P(O)(OH)_2$" means hexylphosphonic acid. "$C_4H_9P(O)(OH)_2$" means butylphosphonic acid. "$C_6H_5P(O)(OH)_2$" means phenylphosphonic acid. Furthermore, "$C_{14}H_{29}NH_2$" means tetradecylamine. "$C_{12}H_{25}NH_2$" means dodecylamine. "$C_6F_{13}$—$C_2H_4$—$NH_2$" means perfluorohexylethylamine. "$C_8H_{17}NH_2$" means octylamine. "$C_{12}H_{25}SH$" means dodecanethiol. "$C_8H_{17}COOH$" means nonanoic acid. Additionally, "DGEEA" means diethylene glycol monoethyl ether acetate. "DGEEA/iPA" means a solvent obtained by combining DGEEA and iPA at a mass ratio of 95:5. "DGEEA/water" means a solvent obtained by combining DGEEA and water at a mass ratio of 95:5. "Water/PGME" means a solvent obtained by combining water and propylene glycol monomethyl ether at a mass ratio of 70:30. "Water/iPA" means a solvent obtained by combining water and iPA at a mass ratio of 70:30.

Example II-51

(ii-1) Preparation of Liquid Chemical for Forming Protecting Film

A mixture of: 0.002 g of octadecylphosphonic acid [$C_{18}H_{37}P(O)(OH)_2$] that serves as a water repellent protecting film forming agent; and 99.998 g of PGMEA that serves as a solvent was stirred for 18 hours thereby obtaining a liquid chemical for forming a protecting film, the liquid chemical having a protecting film forming agent concentration of 0.002 mass %.

(ii-2) Cleaning of Wafer Having Tungsten Film

As a pretreatment step 2, a wafer having a smooth tungsten film (a silicon wafer formed having on its surface a tungsten layer of 50 nm thickness) was immersed in 1 mass % aqueous ammonia for 1 minute, and then immersed in pure water for 1 minute. Furthermore, as a pretreatment step 3, the wafer was immersed in iPA for 1 minute.

(ii-3) Surface Treatment of Surface of Wafer Having Tungsten Film, Using Liquid Chemical for Forming Protecting Film As a protecting film forming step, the wafer having the tungsten film was immersed in the liquid chemical for forming a protecting film at 20° C. for 10 minutes, the liquid chemical having been prepared in the above "(ii-1) Preparation of Liquid Chemical for forming Protecting Film" section. Through this operation, iPA was incorporated into the liquid chemical for forming a protecting film in an amount of 1 mass % relative to the total quantity of the liquid chemical for forming a protecting film. Thereafter, the wafer having the tungsten film was immersed in iPA for 10 seconds, as a subsequent cleaning step. Then, as a drying step, the wafer having the tungsten film was taken out of iPA, followed by spraying air thereon to remove iPA from the surface.

(ii-4) Evaluation of Reusability

An operation where a surface treatment was conducted by immersing a wafer in the liquid chemical for forming a protecting film which liquid chemical had undergone the above [(ii-3) Surface Treatment of Surface of Wafer having Tungsten Film, using Liquid Chemical for forming Protecting Film] section was carried out 4 times, the wafer being of a batch different from that used in (ii-3). With this, iPA of 5 mass % in total, relative to the total quantity of the liquid chemical for forming a protecting film, was incorporated into the liquid chemical for forming a protecting film.

As a result of evaluating the wafer having the tungsten film which wafer was obtained upon being subjected to the surface treatment in the first batch, in a manner discussed in the above [Evaluation of Contact Angle of Protecting Film formed on Wafer Surface] section, a wafer in which an initial contact angle before the surface treatment was smaller than 10° was confirmed to have a contact angle of 68° after the surface treatment, as shown in Table 4. With this, it was confirmed that a water-repellency-imparting effect was exhibited. Additionally, a wafer obtained upon being subjected to the surface treatment in the fifth batch had a contact angle of 68° and therefore confirmed to be reusable.

Examples II-52 to II-70

Upon suitably modifying the conditions employed in Example II-51 (i.e., the cleaning liquid of the pretreatment 2 or 3, the protecting film forming agent, the protecting film forming agent concentration, and the solvent for the liquid chemical for forming a protecting film), a surface treatment was conducted on wafers, followed by evaluation of these. The results are shown in Table 4.

Example II-71

As a pretreatment step 2, a wafer having a smooth ruthenium film (a silicon wafer formed having on its surface a ruthenium layer of 300 nm thickness) was immersed in 1 mass % aqueous ammonia for 1 minute, and then immersed in pure water for 1 minute. Furthermore, as a pretreatment step 3, the wafer was immersed in iPA for 1 minute. With use of this wafer, a surface treatment was performed similarly to Example II-51.

As a result of evaluating the wafer having the ruthenium film which wafer was obtained upon being subjected to the surface treatment in the first batch, in a manner discussed in the above [Evaluation of Contact Angle of Protecting Film formed on Wafer Surface] section, a wafer in which an initial contact angle before the surface treatment was smaller than 10° was confirmed to have a contact angle of 72° after the surface treatment, as shown in Table 4. With this, it was confirmed that a water-repellency-imparting effect was exhibited. Additionally, a wafer obtained upon being subjected to the surface treatment in the fifth batch had a contact angle of 70° and therefore confirmed to be reusable.

Examples II-72 to II-96

Upon suitably modifying the conditions employed in Example II-71 (i.e., the cleaning liquid of the pretreatment 2 or 3, the protecting film forming agent, the protecting film forming agent concentration, and the solvent for the liquid chemical for forming a protecting film), a surface treatment was conducted on wafers, followed by evaluation of these. The results are shown in Tables 4 and 5.

TABLE 5

| | Liquid Chemical for Forming Protecting Film | | | | Solvent | | Contact | |
| --- | --- | --- | --- | --- | --- | --- | --- | --- |
| | Protecting Film Forming Agent | Protecting Film Forming Agent Concentration [mass %] | Solvent | Wafer | incorporated into Liquid Chemical for Forming Protecting Film | Contact Angle before Treatment [°] | Angle after Surface Treatment [°] | |
| | | | | | | | 1st Batch | 5th Batch |
| Example II-81 | $C_6F_{13}$—$C_2H_4$—P(O)(OH)$_2$ | 0.01 | Water | Ru | iPA | <10 | 60 | 60 |
| Example II-82 | $C_6F_{13}$—$C_2H_4$—P(O)(OH)$_2$ | 0.1 | DGEEA/iPA | Ru | iPA | <10 | 78 | 78 |
| Example II-83 | $C_6F_{13}$—$C_2H_4$—P(O)(OH)$_2$ | 0.1 | DGEEA/Water | Ru | iPA | <10 | 74 | 74 |
| Example II-84 | $C_6F_{13}$—$C_2H_4$—P(O)(OH)$_2$ | 0.1 | Water/iPA | Ru | iPA | <10 | 62 | 62 |
| Example II-85 | $C_{14}H_{29}NH_2$ | 0.1 | PGMEA | Ru | iPA | <10 | 96 | 96 |
| Example II-86 | $C_{12}H_{25}NH_2$ | 0.1 | PGMEA | Ru | iPA | <10 | 94 | 94 |
| Example II-87 | $C_6F_{13}$—$C_2H_4$—$NH_2$ | 0.1 | PGMEA | Ru | Water | <10 | 104 | 104 |
| Example II-88 | $C_6F_{13}$—$C_2H_4$—$NH_2$ | 0.1 | PGMEA | Ru | iPA | <10 | 104 | 104 |
| Example II-89 | $C_8H_{17}NH_2$ | 1 | PGMEA | Ru | Water | <10 | 90 | 88 |
| Example II-90 | $C_8H_{17}NH_2$ | 1 | iPA | Ru | Water | <10 | 92 | 90 |
| Example II-91 | $C_8H_{17}NH_2$ | 1 | DGEEA | Ru | Water | <10 | 90 | 88 |
| Example II-92 | $C_8H_{17}NH_2$ | 1 | DGEEA/Water | Ru | Water | <10 | 88 | 86 |
| Example II-93 | $C_8H_{17}NH_2$ | 1 | PGMEA | Ru | iPA | <10 | 90 | 90 |
| Example II-94 | $C_8H_{17}NH_2$ | 1 | iPA | Ru | iPA | <10 | 92 | 92 |
| Example II-95 | $C_8H_{17}NH_2$ | 1 | DGEEA | Ru | iPA | <10 | 90 | 90 |
| Example II-96 | $C_8H_{17}NH_2$ | 1 | DGEEA/Water | Ru | iPA | <10 | 88 | 88 |
| Comparative Example II-1 | $(CH_3)_3SiN(CH_3)_2$ | 5 | PGMEA | TiN | Water | <10 | 18 | <10 |

Comparative Example II-1

A mixture of: 5 g of N,N-dimethylaminotrimethylsilane [$(CH_3)_3SiN(CH_3)_2$] that serves as a protecting film forming agent; and 95 g of PGMEA that serves as a solvent was stirred for about 5 minutes thereby obtaining a liquid chemical having a protecting film forming agent concentration of 5 mass %. The procedure of Example II-2 was repeated with the exception that this liquid chemical was used as the liquid chemical for forming a protecting film.

As a result of evaluating the wafer having the titanium nitride film which wafer was obtained upon being subjected to the surface treatment in the first batch, in a manner discussed in the above [Evaluation of Contact Angle of Protecting Film formed on Wafer Surface] section, a wafer in which an initial contact angle before the surface treatment was smaller than 10° was confirmed to have a contact angle of 18° after the surface treatment, as shown in Table 5. With this, it was confirmed that a water-repellency-imparting effect was not sufficient. Additionally, a wafer obtained upon being subjected to the surface treatment in the fifth batch had a contact angle of smaller than 10°, in other words, a contact angle equal to the initial one, which did not exhibit the water-repellency-imparting effect. Therefore, it was confirmed that this liquid chemical was not reusable.

EXPLANATION OF REFERENCE NUMERALS

1 Wafer
2 Uneven pattern of a surface of the wafer
3 Projected portions of the pattern
4 Recessed portions of the pattern
5 Widths of the recessed portions
6 Heights of the projected portions
7 Widths of the projected portions
8 Liquid chemical for forming a protecting film, retained in the recessed portions 4
9 Liquid retained in the recessed portions 4
10 Protecting film

The invention claimed is:

1. A liquid chemical for forming a water repellent protecting film,
the liquid chemical for forming a water repellent protecting film being for forming a water repellent protecting film on a wafer having at its surface an uneven pattern and containing at least one kind of element selected from the group consisting of titanium, tungsten, aluminum, copper, tin, tantalum and ruthenium at surfaces of recessed portions of the uneven pattern, the water repellent protecting film being formed at least on the surfaces of the recessed portions, the liquid chemical comprising:
a water repellent protecting film forming agent; and
water,
wherein the concentration of the water relative to the total quantity of a solvent contained in the liquid chemical is not smaller than 50 mass %, and
wherein the water repellent protecting film forming agent is $C_6F_{13}C_2H_4P(O)(OH)_2$.

2. The liquid chemical for forming a water repellent protecting film, as claimed in claim 1, wherein an upper limit of the concentration of the water repellent protecting film forming agent relative to the total quantity of the liquid chemical is 1 mass %.

3. The liquid chemical for forming a water repellent protecting film, as claimed in claim 1, wherein the concentration of the water repellent protecting film forming agent relative to the total quantity of the liquid chemical is 0.001 to 1 mass %.

4. The liquid chemical for forming a water repellent protecting film, as claimed in claim 1, wherein the concentration of the water repellent protecting film forming agent relative to the total quantity of the liquid chemical is 0.0005 to 1 mass %.

5. The liquid chemical for forming a water repellent protecting film, as claimed in claim 1, wherein the concentration of the water repellent protecting film forming agent relative to the total quantity of the liquid chemical is 0.0005 to 0.8 mass %.

6. The liquid chemical for forming a water repellent protecting film, as claimed in claim 1, wherein the solvent is water or a liquid mixture containing water and at least one selected from the group consisting of esters, ethers, ketones, and polyalcohols having no hydroxyl group.

* * * * *